US012743026B2

(12) United States Patent
Kong et al.

(10) Patent No.: US 12,743,026 B2

(45) Date of Patent: Sep. 22, 2026

(54) CRITICAL DIMENSION INSPECTION METHOD AND SEMICONDUCTOR DEVICE MANUFACTURING METHOD USING THE SAME

(71) Applicant: Samsung Electronics Co., Ltd., Suwon-si (KR)

(72) Inventors: Su Bin Kong, Suwon-si (KR); Sang-Ho Yun, Suwon-si (KR); Woo Jin Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 673 days.

(21) Appl. No.: 18/302,375

(22) Filed: Apr. 18, 2023

(65) Prior Publication Data

US 2024/0045342 A1 Feb. 8, 2024

(30) Foreign Application Priority Data

Aug. 4, 2022 (KR) ........................ 10-2022-0097062

(51) Int. Cl.

*G03F 7/00* (2006.01)
*G03F 7/039* (2006.01)
*G03F 7/20* (2006.01)

(52) U.S. Cl.

CPC ........ *G03F 7/70625* (2013.01); *G03F 7/0025* (2013.01); *G03F 7/0392* (2013.01); *G03F 7/2002* (2013.01); *G03F 7/70466* (2013.01)

(58) Field of Classification Search

CPC .. G03F 7/70625; G03F 7/0025; G03F 7/0392; G03F 7/2002; G03F 7/70466;

(Continued)

(56) References Cited

U.S. PATENT DOCUMENTS 6,548,312 B1 * 4/2003 Hayano ............... G03F 7/70433 430/394

7,935,965 B1 5/2011 Brozek (Continued)

FOREIGN PATENT DOCUMENTS

JP 2007/528114 A 10/2007
KR 100780776 B1 11/2007

(Continued)

OTHER PUBLICATIONS

Korean Office Action dated Jun. 15, 2026 for corresponding Korean Patent Application No. 10-2022-0097062 and its English-language translation.

*Primary Examiner* — Stewart A Fraser

(74) *Attorney, Agent, or Firm* — Harness, Dickey & Pierce, P.L.C.

(57) ABSTRACT

A method for inspecting a critical dimension may include providing a substrate, applying a photoresist on the substrate, variably irradiating a dose of light onto the photoresist, performing a photo process to develop the photoresist to form a photoresist pattern, performing an etching process using the photoresist pattern as an etching mask to form a plurality of patterns, measuring a width of each of the plurality of patterns and a spacing between adjacent ones of the plurality of patterns, and identifying a cause of a defect in the photo process based on the measured width and the measured spacing.

20 Claims, 29 Drawing Sheets

(58) Field of Classification Search
CPC ............. G03F 7/70558; G03F 7/70491; H10P 74/203; H10P 76/2041
See application file for complete search history.

(56) References Cited

U.S. PATENT DOCUMENTS

| | | | | |
|---|---|---|---|---|
| 8,572,518 | B2 | 10/2013 | Tyminski et al. | |
| 9,021,406 | B2 | 4/2015 | Hashimoto | |
| 2005/0270504 | A1* | 12/2005 | Takagi | G03F 7/706 430/311 |
| 2014/0370719 | A1* | 12/2014 | Komine | G03F 9/7026 438/795 |
| 2019/0378012 | A1* | 12/2019 | Tripodi | G06N 3/0455 |

FOREIGN PATENT DOCUMENTS

| | | | |
|---|---|---|---|
| KR | 2010/0127666 | A | 12/2010 |
| KR | 2011/0011530 | A | 2/2011 |
| KR | 2011/0041985 | A | 4/2011 |
| KR | 2012/0120846 | A | 11/2012 |
| KR | 2012/0122759 | A | 11/2012 |
| KR | 102245698 | B1 | 4/2021 |

* cited by examiner

CRITICAL DIMENSION INSPECTION METHOD AND SEMICONDUCTOR DEVICE MANUFACTURING METHOD USING THE SAME

CROSS-REFERENCE TO RELATED APPLICATION

This application claims priority from Korean Patent Application No. 10-2022-0097062, filed on Aug. 4, 2022 in the Korean Intellectual Property Office, and all the benefits accruing therefrom under 35 U.S.C. 119, the entire contents of which are herein incorporated by reference.

BACKGROUND

Field

The present disclosure relates to a critical dimension inspection method and/or a semiconductor device manufacturing method using the same.

Description of Related Art

In manufacturing a semiconductor device, various patterns may be formed on a wafer. In particular, when the patterns are formed using a multi-patterning process, defects in which widths of the formed patterns and spacings between the patterns are not uniform may occur frequently. The defects in which the widths of the patterns and the spacings between the patterns are not constant may be caused by a photo process or an etching process. Various schemes have been tried to discover causes of the defects in the photo process or the etching process. However, the schemes may take a lot of unnecessary time. Further, it is not clear whether the cause of the defect is due to the photo process or the etching process.

Accordingly, research for diagnosing the cause of the defect quickly and accurately may be required.

SUMMARY

The present disclosure relates to an efficient critical dimension inspection method.

The present disclosure also relates to a semiconductor device manufacturing method using an efficient critical dimension inspection method.

Features and/or aspects of inventive concepts according to the present disclosure are not limited to those above. Other features, aspects, and/or advantages that are not mentioned may be understood based on following description, and may be more clearly understood based on embodiments according to the present disclosure. Further, it will be easily understood that features, aspects, and/or advantages according to inventive concepts of the present disclosure may be realized using means shown in the claims and combinations thereof.

According to an embodiment of inventive concepts, a method for inspecting a critical dimension may include applying a photoresist on a substrate; variably irradiating a dose of light onto the photoresist; performing a photo process on the photoresist, the photo process including developing the photoresist to form a photoresist pattern; forming a plurality of patterns on the substrate, the forming the plurality of patterns including performing an etching process using the photoresist pattern as an etching mask; measuring a width of each of the plurality of patterns and a spacing between adjacent ones of the plurality of patterns to obtain a measured width and a measured spacing; and identifying a cause of a defect in the photo process based on the measured width and the measured spacing.

According to an embodiment of inventive concepts, a method for manufacturing a semiconductor device may include providing a first substrate; and forming a plurality of second patterns on the first substrate by performing a first photo process under a first condition and an etching process under a second condition. The first condition may be obtained using a critical dimension inspection method. The critical dimension inspection method may include applying a photoresist on a second substrate different from the first substrate, variably irradiating a dose of light onto the photoresist, performing a second photo process on the photoresist, the second photo process including developing the photoresist to form a photoresist pattern, forming a plurality of first patterns on the second substrate by performing an etching process under the second condition using the photoresist pattern as an etching mask, measuring a width of each of the plurality of first patterns and a spacing between adjacent ones of the plurality of first patterns to obtain a measured width and a measured spacing, identifying an identified cause of a defect in the second photo process based on the measured width and the measured spacing, and selecting the first condition based on the identified cause of the defect.

According to an embodiment of inventive concepts, a method for manufacturing a semiconductor device may include forming a plurality of word-lines in a first substrate and extending in a first direction; forming a plurality of bit-lines on the first substrate and extending in a second direction, the second direction intersecting the first direction, the forming the plurality of bit-lines including a first photo process under a first condition and an etching process under a second condition; forming a plurality of contacts connected to the first substrate, each of the plurality of contacts being disposed between adjacent ones of the plurality of bit-lines; and forming a plurality of capacitors respectively connected to the plurality of contacts. The first condition may be obtained through a critical dimension inspection method. The critical dimension inspection method may include forming a dummy word-line in a second substrate and extending in the first direction, the second substrate being different from the first substrate, applying a photoresist on the second substrate, variably irradiating a dose of light onto the photoresist, performing a second photo process on the photoresist, the second photo process including developing the photoresist to form a photoresist pattern, performing an etching process under the second condition using the photoresist pattern as an etching mask to form a plurality of dummy bit-lines extending in the second direction, measuring a width in the first direction of each of the plurality of dummy bit-lines and measuring a spacing between two dummy bit-lines adjacent to each other in the first direction of the plurality of dummy bit-lines to obtain a measured width and a measured spacing, identifying an identified cause of a defect in the second photo process based on the measured width and the measured spacing, and selecting the first condition based on the identified cause of the defect.

Specific details of other embodiments are included in the detailed description and drawings.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTION

Hereinafter, a critical dimension inspection method according to an embodiment will be described with reference to FIG. 1 to FIG. 9.

FIGS. 1 to 9 are diagrams for illustrating a critical dimension inspection method according to an embodiment.

Figure 1:
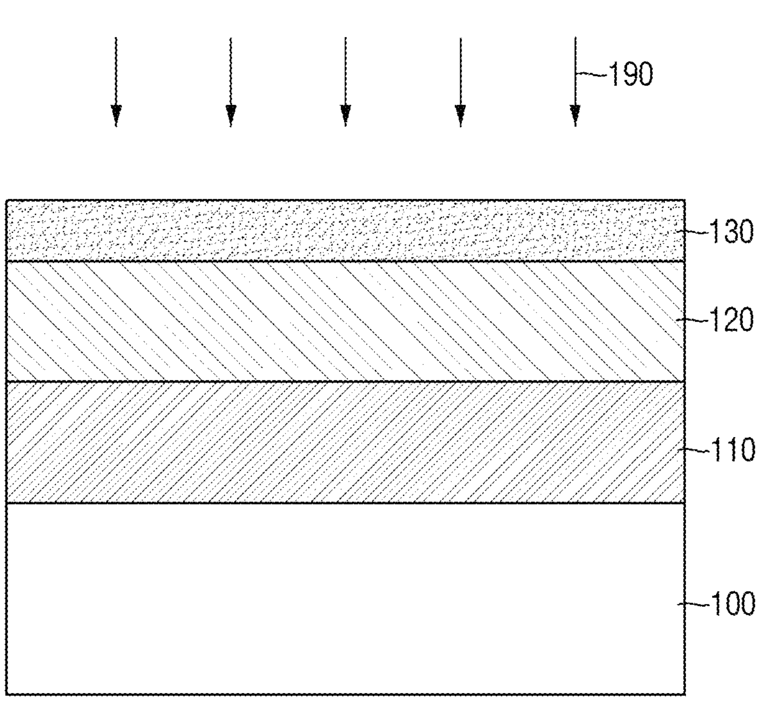
FIGS. 1 to 9 are diagrams for illustrating a critical dimension inspection method according to an embodiment.

Referring to FIG. 1, a first substrate 100 is provided. The first substrate 100 may be embodied as, for example, a silicon single crystal substrate or an SOI (Silicon on Insulator) substrate. Alternatively, the first substrate 100 may include silicon germanium, SGOI (silicon germanium on insulator), indium antimonide, a lead telluride compound, indium arsenide, indium phosphide, gallium arsenide, or gallium antimonide. However, the present disclosure is not limited thereto.

A pre-first pattern 110 may be formed on the first substrate 100. The pre-first pattern 110 may be a portion of a pattern to be formed when the semiconductor device is manufactured. In one example, when the pattern formed using the pre-first pattern 110 acts as a fin-shaped pattern, the pre-first pattern 110 may include silicon (Si). In another example, when the pattern formed using the pre-first pattern 110 acts as a wiring pattern, the pre-first pattern 110 may include a conductive material, for example, copper (Cu), aluminum (Al), nickel (Ni), or tungsten (W).

A mask film 120 may be formed on the pre-first pattern 110. The mask film 120 may include, for example, at least one of a SOH (spin on hardmask film) or a carbon polymer film. However, the present disclosure is not limited thereto.

A first photoresist 130 may be formed on the mask film 120. The first photoresist 130 may include a chemical substance whose properties change in response to light. For example, the first photoresist 130 may include a positive photoresist or a negative photoresist. The positive photoresist may include a chemical substance whose a portion exposed to light is dissolved. The negative photoresist may include a chemical substance whose a portion that is not exposed to light is dissolved.

A dose of light may be irradiated onto the first photoresist 130 (See a reference number 190). The dose of light may be variably irradiated onto the first photoresist 130. The phrase "being variably irradiated" may mean that an amount of the dose of light irradiated onto the first photoresist 130 is non-uniform. When the dose of light is variably irradiated onto the first photoresist 130, influence of an existing critical dimension gradient may be excluded as much as possible.

Figure 2:
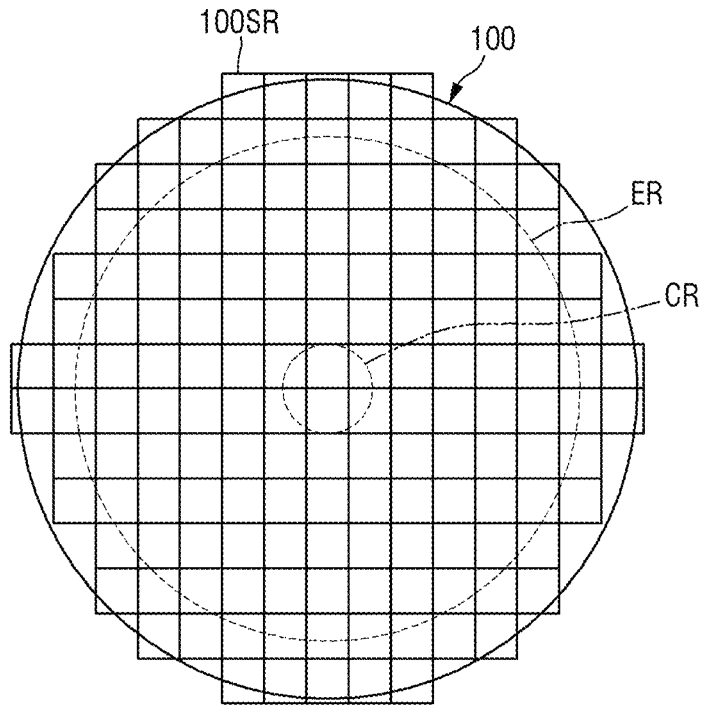
Figure 3:
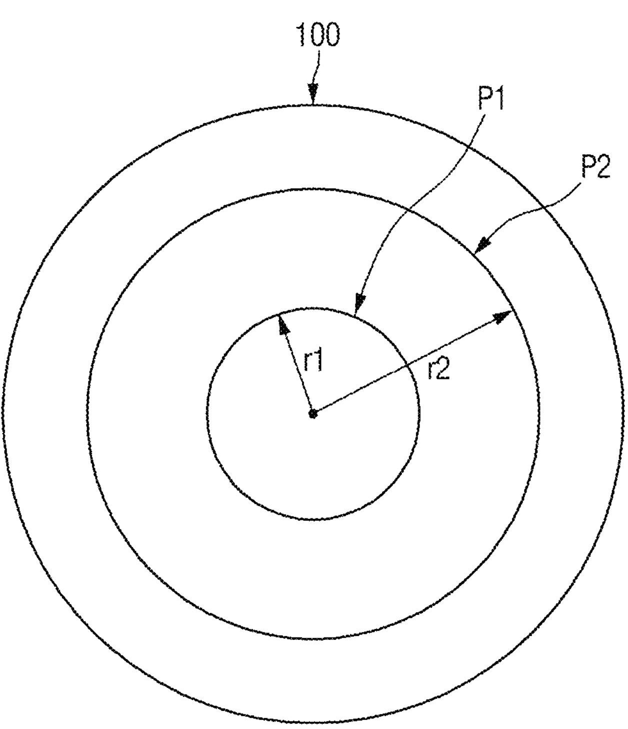

For example, referring to FIG. 2 and FIG. 3, the first substrate 100 may have a circular shape in a plan view. The first photoresist 130 formed on the first substrate 100 may have a circular shape in a plan view.

In FIG. 2, the first substrate 100 may include a plurality of shot areas 100SR. Each of the shot areas 100SR may mean a minimum area by which the first photoresist 130 is developed. The plurality of shot areas 100SR may be regularly arranged on the first substrate 100.

Variably irradiating the dose of light onto the first photoresist 130 may include variably irradiating the dose of light onto an entirety of a face of the first substrate 100 such that the dose of light is uniformly irradiated onto each of the plurality of shot areas 100SR. In order to minimize the influence of the critical dimension gradient within each of the shot areas 100SR, the dose of light may be uniformly irradiated onto each of the shot areas 100SR. However, the technical idea of the present disclosure is not limited thereto.

In FIG. 3, a first position P1 spaced apart from a center of the first substrate 100 by a first distance r1 and a second position P2 spaced apart by a second distance r2 from the center of the first substrate 100 may be provided.

The variable irradiation of the dose of light onto the first photoresist 130 may mean that the dose of light is variably irradiated onto the entirety of the surface of the first substrate 100 such that the dose of light is uniformly irradiated to and along the first position P1 spaced apart by the first distance r1 from the center of the first substrate 100.

Further, the variable irradiation of the dose of light onto the first photoresist 130 may mean that the dose of light is variably irradiated onto the entirety of the surface of the first substrate 100 such that the dose of light us uniformly irradiated to and along the second position P2 spaced apart by the second distance r2 from the center of the first substrate 100. In this regard, an amount of the dose of light irradiated to and along the first position P1 may be different from an amount of the dose of light irradiated to and along the second position P2. Accordingly, the influence of the critical dimension gradient based on the distance away from the center of the first substrate 100 may be excluded as much as possible.

Figure 4:
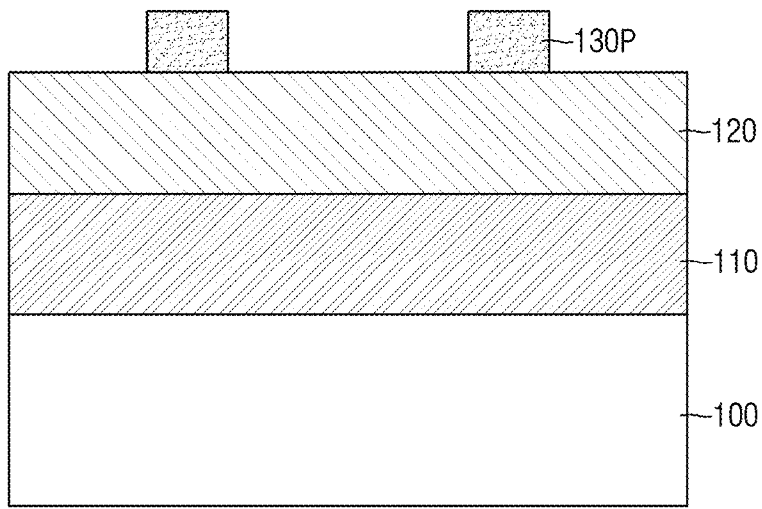

Referring to FIG. 4, a first photoresist pattern 130P may be formed by developing the first photoresist 130 in a photo process and a developing process. When the first photoresist 130 is the positive photoresist, the first photoresist pattern 130P may be a portion not exposed to light. When the first photoresist 130 is the negative photoresist, the first photoresist pattern 130P may be a portion exposed to light.

Figure 5:
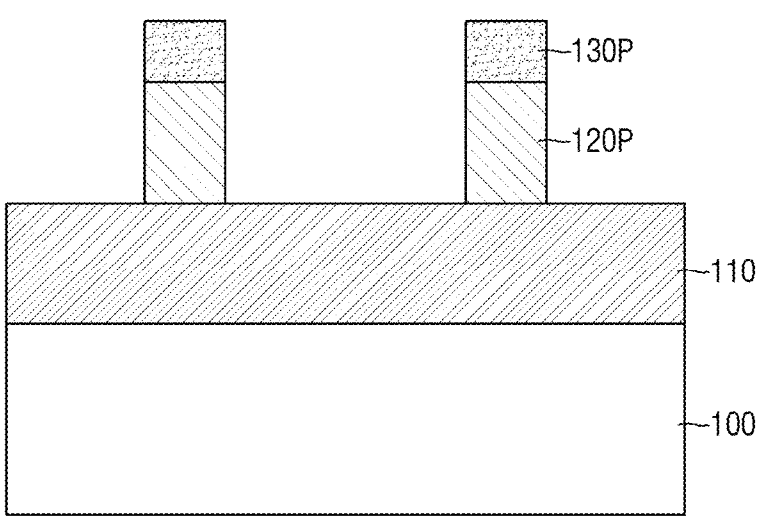

Referring to FIG. 5, in an etching process, the mask film 120 may be etched using the first photoresist pattern 130P as an etching mask. A mask pattern 120P may be formed by etching the mask film 120.

Figure 6:
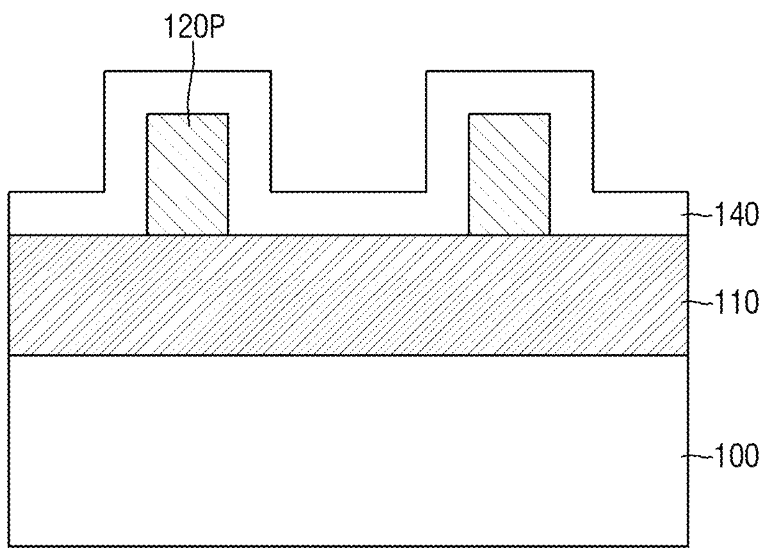

Referring to FIG. 6, a sacrificial film 140 may be formed along and on a top face of the pre-first pattern 110, a sidewall of the mask pattern 120P, and a top face of the mask pattern 120P. The sacrificial film 140 may have a uniform thickness. The sacrificial film 140 may be formed using an ALD (atomic layer deposition) process. The sacrificial film 140 may include, for example, silicon oxide. However, the present disclosure is not limited thereto.

Figure 7:
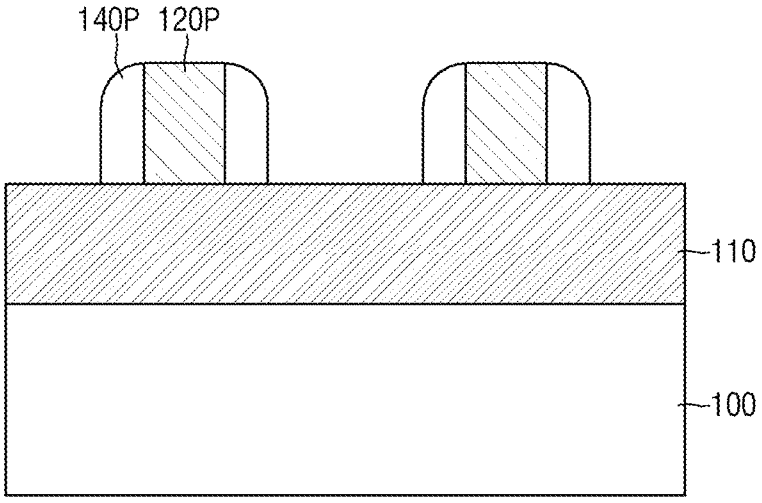

Referring to FIG. 7, a portion of the sacrificial film 140 may be removed to form a sacrificial film pattern 140P. The portion of the sacrificial film 140 is removed to expose a top face of the mask pattern 120P and a top face of the pre-first pattern 110.

Figure 8:
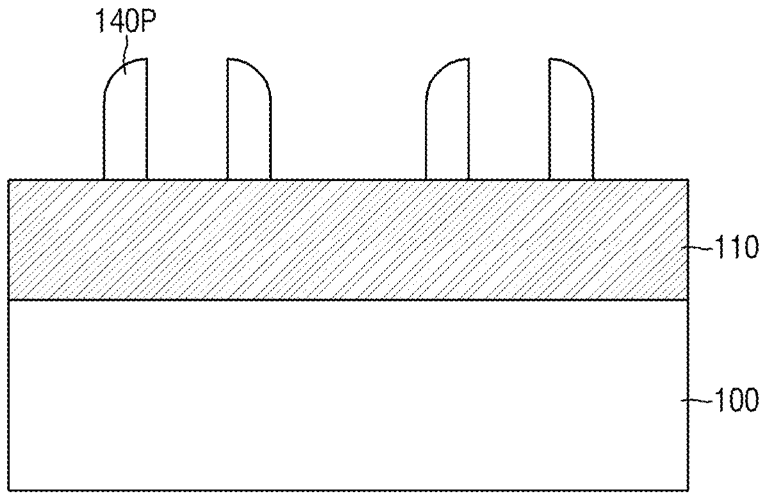

Referring to FIG. 8, the mask pattern 120P may be removed. The mask pattern 120P may be removed to expose a top face of the pre-first pattern 110.

Figure 9:
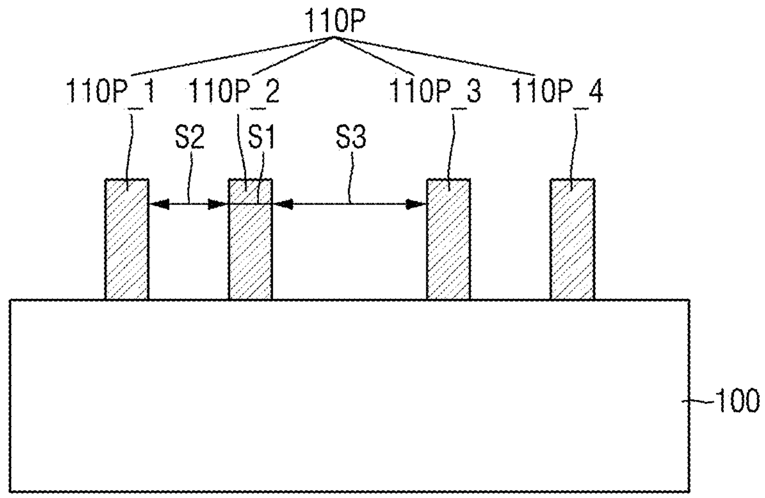

Referring to FIG. 9, a plurality of first patterns 110P may be formed using the sacrificial film pattern 140P as an etching mask in an etching process. The plurality of first patterns 110P may be formed by removing a portion of the pre-first pattern 110.

Widths S1 of the plurality of first patterns 110P may be equal to each other. The width S1 of each of the plurality of first patterns 110P may be substantially equal to a width of the sacrificial film pattern 140P. The plurality of first patterns 110P may be spaced apart from each other. For example, the plurality of first patterns 110P may include a first sub-pattern 110P_1, a second sub-pattern 110P_2, a third sub-pattern 110P_3, and a fourth sub-pattern 110P_4. The first sub-pattern 110P_1 and the second sub-pattern 110P_2 may be spaced apart from each other by a first spacing S2. The first spacing S2 may depend on a width of the first photoresist pattern 130P in FIG. 4. The second sub-pattern 110P_2 and the third sub-pattern 110P_3 may be spaced apart from each other by a second spacing S3. The second spacing S3 may depend on a spacing between the first photoresist patterns 130P in FIG. 4.

In some embodiments, the width S1 of the plurality of first patterns 110P, the first spacing S2 between the plurality of first patterns 110P, and the second spacing S3 between the plurality of first patterns 110P may be different from each other. When the width S1 of the plurality of first patterns 110P, the first spacing S2 between the plurality of first patterns 110P, and the second spacing S3 between the plurality of first patterns 110P are different from each other, it may be determined that there is a defect in the photo process or the etching process.

When the dose of light is variably irradiated, the first spacing S2 may vary depending on the amount of the irradiated dose of light when an etching process condition is not changed. When the etching process condition is not changed, the width S1 of each of the plurality of first patterns 110P may be constant regardless of the amount of the irradiated dose of light. Therefore, the dose of light may be variably irradiated and then the plurality of first patterns 110P may be formed and then the widths S1 of the plurality of first patterns 110P and the spacings S2 and S3 between the plurality of first patterns 110P may be measured. Thus, the cause of the defect may be identified in the photo process based on the measurement result.

The critical dimension defect between the first patterns 110P may be solved by changing a condition of the photo process based on the identified defect cause. However, even when the identified defect cause is used, a defect cause in the etching process may not be identified. However, the technical idea of the present disclosure is not limited thereto.

Figure 10:
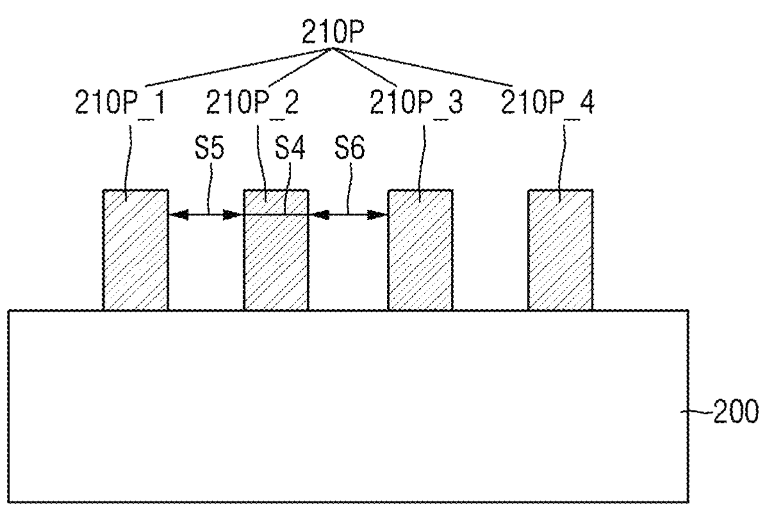
FIG. 10 is a diagram for illustrating a semiconductor device manufactured using a critical dimension inspection method according to some embodiments.

FIG. 10 is a diagram for illustrating a semiconductor device manufactured using a critical dimension inspection method according to some embodiments.

Referring to FIG. 10, a second substrate 200 may be provided.

Second patterns 210P may be formed on the second substrate 200.

The second substrate 200 and the first substrate 100 may be different from each other. The second substrate 200 may be embodied as, for example, a silicon single crystal substrate or an SDI (Silicon on Insulator) substrate. Alternatively, the second substrate 200 may include silicon germanium, SGOI (silicon germanium on insulator), indium antimonide, a lead telluride compound, indium arsenide, indium phosphide, gallium arsenide, or gallium antimonide. However, the present disclosure is not limited thereto.

Although not shown, a pre-second pattern, a mask film, and a photoresist may be sequentially formed on the second substrate 200. A dose of light may be uniformly irradiated onto the photoresist. Subsequently, the plurality of second patterns 210P may be formed using a photo process under a first condition and an etching process under a second condition. The first condition may be inferred (or selected) based on the critical dimension inspection method as described above using FIG. 1 to FIG. 9. For example, the cause of the defect in the photo process may be identified using the critical dimension inspection method. The first condition may be inferred (or selected) based on the identified defect cause. The plurality of second patterns 210P may be formed by applying the first condition. The second condition may be the same as the condition of the etching process used in the critical dimension inspection method as described above using FIG. 1 to FIG. 9.

The plurality of second patterns 210P may include various materials. In one example, when each of the plurality of second patterns 210P acts as a fin-shaped pattern of a logic device, the plurality of second patterns 210P may include silicon (Si). In another example, when each of the plurality of second patterns 210P acts as a wiring pattern, the plurality of second patterns 210P may include a conductive material. In still another example, when each of the plurality of second patterns 210P acts as a bit-line of a semiconductor memory device, each of the plurality of second patterns 210P may be embodied as a multilayer including a conductive material.

Widths S4 of the plurality of second patterns 210P may be equal to each other. The plurality of second patterns 210P may be spaced apart from each other. For example, the plurality of second patterns 210P may include a first sub-pattern 210P_1, a second sub-pattern 210P_2, a third sub-pattern 210P_3, and a fourth sub-pattern 210P_4. The first sub-pattern 210P_1 and the second sub-pattern 210P_2 may be spaced apart from each other by a third spacing S5. The second sub-pattern 210P_2 and the third sub-pattern 210P_3 may be spaced apart from each other by a fourth spacing S6.

When the plurality of second patterns 210P are formed using the photo process under the first condition, the widths S4 of, the third spacing S5 between, and the fourth spacing S6 between the plurality of second patterns 210P may be substantially equal to each other.

In some embodiments, in FIG. 2, the first substrate 100 may include a center area CR and an edge area ER. Similarly, the second substrate 200 may also include a center area and an edge area. The center area CR may be a center area, and the edge area ER may be an edge area. The edge area ER may surround the center area CR.

In some embodiments, a difference between an average value of the spacings between the second patterns 210P in the center area CR and an average value of the spacings between the second patterns 210P in the edge area ER may be 0.3 or smaller. However, the technical idea of the present disclosure is not limited thereto. As the difference between the average value of the spacings between the patterns in the center area CR and the average value of the spacings between the patterns in the edge area ER is smaller, it may be determined that the critical dimension defect is reduced.

With reference to a following Table 1, effects of the critical dimension inspection method and the semiconductor device manufacturing method using the critical dimension inspection method according to some embodiments of the present disclosure will be described in more detail.

The Table 1 compares a difference between the average value of the spacings between the patterns in the center area and the average value of the spacings between the spacings in the edge area in Comparative Example with a difference between the average value of the spacings between the patterns in the center area and the average value of the spacings between the spacings in the edge area in Present Example. In Comparative Example, the dose of light was applied uniformly, while in Present Example, the dose of light was variably irradiated.

TABLE 1

| | Comparative Example | Present Example |
|---|---|---|
| Average value of spacings between patterns in center area | 0.71 nm | 0.65 nm |
| Average value of spacings between patterns in edge area | 1.31 nm | 0.89 nm |
| Difference | 0.6 nm | 0.24 nm |

Referring to Table 1, it may be identified that the difference in Present Example is smaller than the difference in Comparative Example. That is, it may be determined that the critical dimension defect is reduced in a case where the dose of light is variably irradiated, compared to a case where the dose of light is uniformly irradiated.

FIG. 11 to FIG. 19 are diagrams for illustrating a critical dimension inspection method according to another embodiment.

Figure 11:
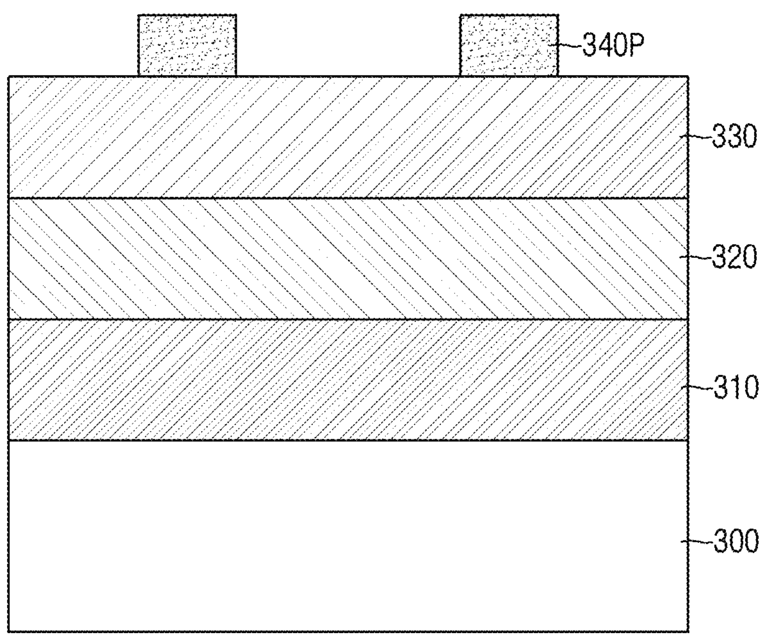
FIG. 11 to FIG. 19 are diagrams for illustrating a critical dimension inspection method according to another embodiment.

Referring to FIG. 11, a third substrate 300 is provided. The third substrate 300 may be embodied as, for example, a silicon single crystal substrate or an SOI (Silicon on Insulator) substrate. Alternatively, the third substrate 300 may include silicon germanium, SGOI (silicon germanium on insulator), indium antimonide, a lead telluride compound, indium arsenide, indium phosphide, gallium arsenide, or gallium antimonide. However, the present disclosure is not limited thereto.

A pre-third pattern 310 may be formed on the third substrate 300. The pre-third pattern 310 may be a portion of a pattern to be formed when the semiconductor device is manufactured. In one example, when the pattern formed using the pre-third pattern 310 acts as a fin-shaped pattern, the pre-third pattern 310 may include silicon (Si). In another example, when the pattern formed using the pre-third pattern 310 acts as a wiring pattern, the pre-third pattern 310 may include a conductive material, for example, copper (Cu), aluminum (Al), nickel (Ni), or tungsten (W).

A first mask film 320 may be formed on the pre-third pattern 310. The first mask film 320 may include, for example, at least one of a SOH (spin on hardmask) film or a carbon polymer film. However, the present disclosure is not limited thereto.

A second mask film 330 may be formed on the first mask film 320. The second mask film 330 may include, for example, at least one of a SOH (spin on hardmask film) or a carbon polymer film. However, the present disclosure is not limited thereto.

Although not shown, a second photoresist may be formed on the second mask film 330. The second photoresist may include a chemical substance whose properties change in response to light. For example, the second photoresist may include a positive photoresist positive photoresist or a negative photoresist negative photoresist. The positive photoresist may include a chemical substance whose a portion exposed to light is dissolved. The negative photoresist may include a chemical substance whose a portion that is not exposed to light is dissolved.

A dose of light may be irradiated onto the second photoresist. The dose of light may be variably irradiated onto the second photoresist. A second photoresist pattern 340P may be formed by developing the second photoresist in a photo process and a developing process. When the second photoresist is a positive photoresist, the second photoresist pattern 340P may be a portion not exposed to the light. When the second photoresist is a negative photoresist, the second photoresist pattern 340P may be a portion exposed to the light.

Figure 12:
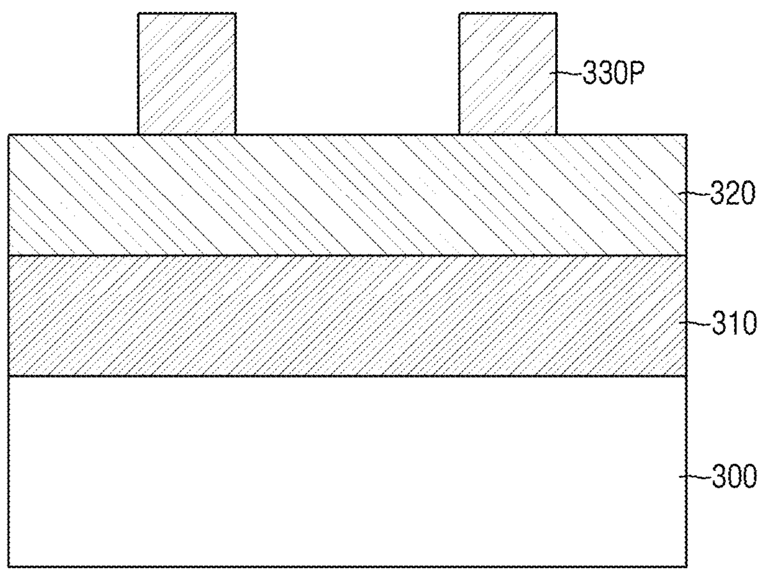

Referring to FIG. 12, in an etching process, the second mask film 330 may be etched using the second photoresist pattern 340P as an etching mask. A second mask pattern 330P may be formed by etching the second mask film 330.

Figure 13:
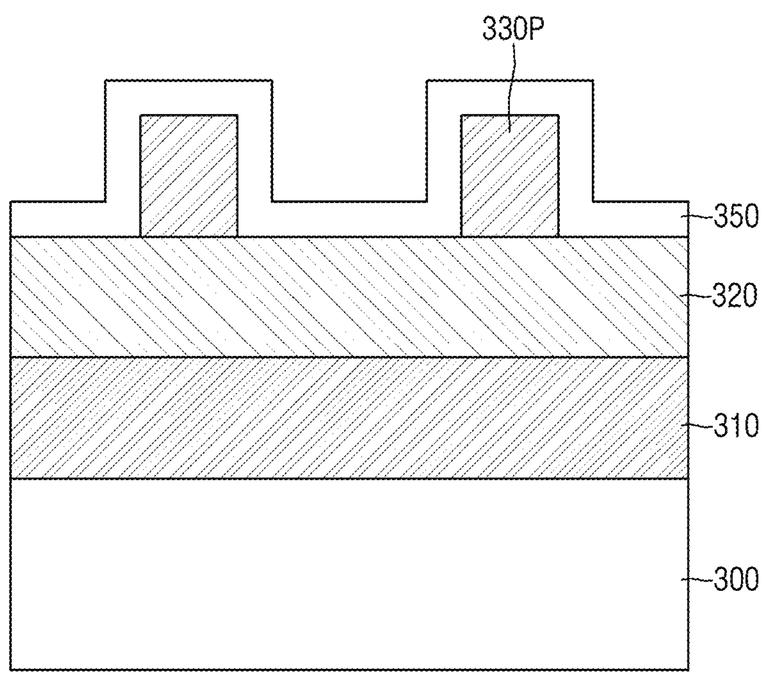

Referring to FIG. 13, a first sacrificial film 350 may be formed along and on a top face of the first mask film 320, a sidewall of the second mask pattern 330P, and a top face of the second mask pattern 330P. The first sacrificial film 350 may have a uniform thickness. The first sacrificial film 350 may be formed using an ALD (atomic layer deposition) process. The first sacrificial film 350 may include, for example, silicon oxide. However, the present disclosure is not limited thereto.

Figure 14:
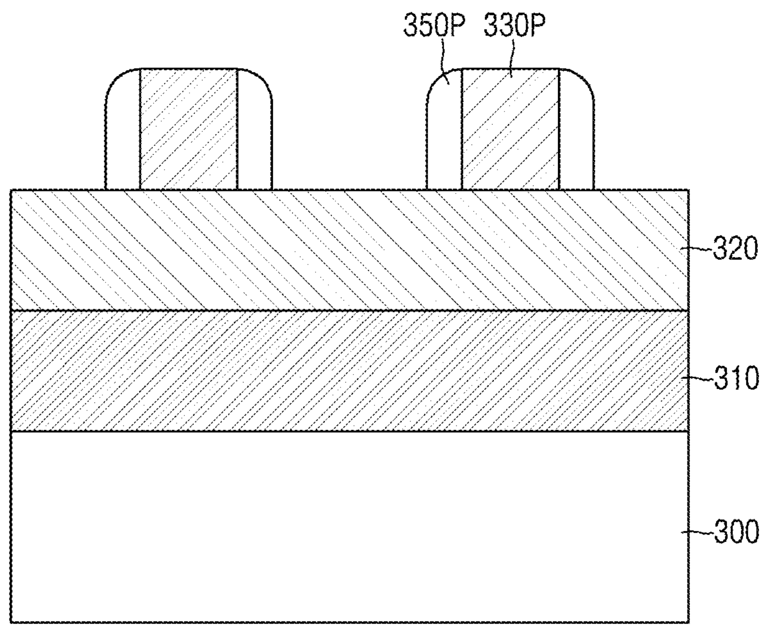

Referring to FIG. 14, a portion of the first sacrificial film 350 may be removed to form a first sacrificial film pattern 350P. A portion of the first sacrificial film 350 is removed so as to expose a top face of the first mask film 320. A portion of the first sacrificial film 350 is removed so as to expose a top face of the second mask pattern 330P.

Figure 15:
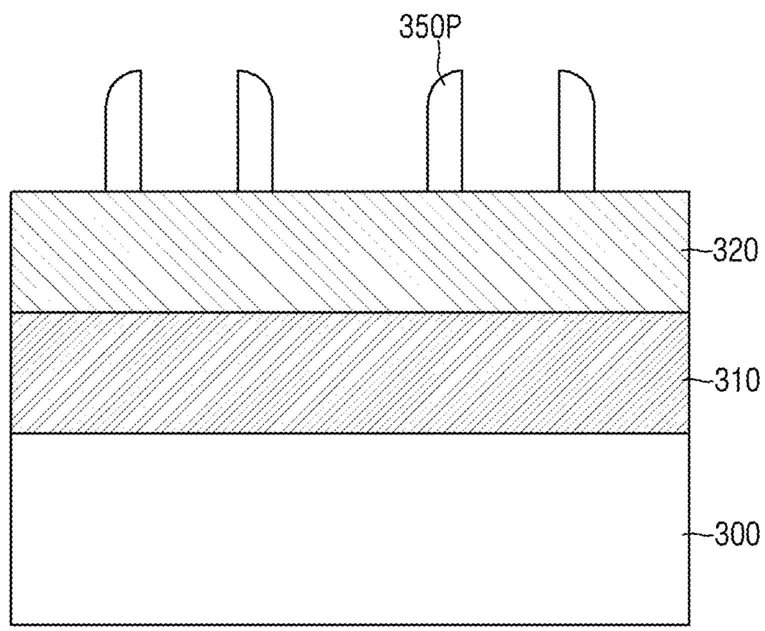

Referring to FIG. 15, the second mask pattern 330P may be removed. The second mask pattern 330P may be removed to expose a top face of the first mask film 320.

Figure 16:
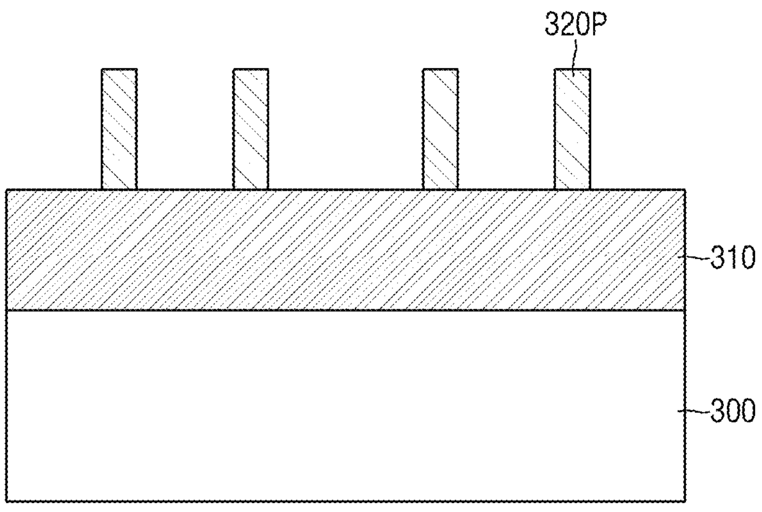

Referring to FIG. 16, in an etching process, the first mask film 320 may be etched using the first sacrificial film pattern 350P as an etching mask. The first mask film 320 may be etched to form a first mask pattern 320P.

Figure 17:
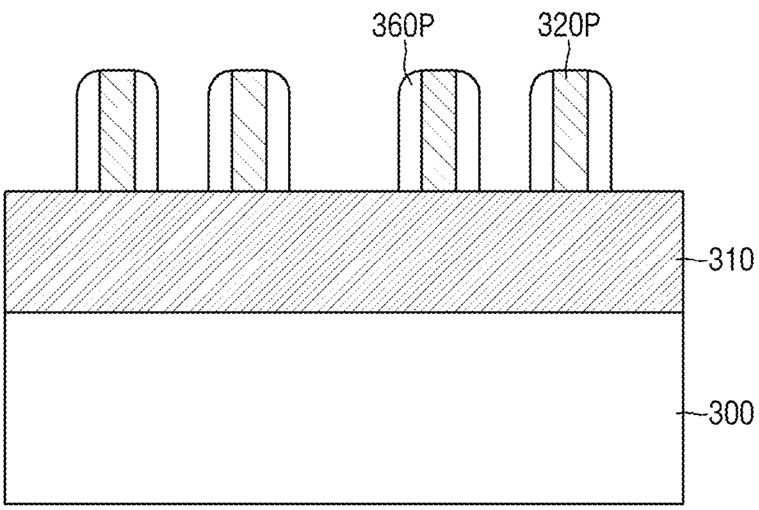

Referring to FIG. 17, a second sacrificial film pattern 360P may be formed on a sidewall of the first mask pattern 320P. The second sacrificial film pattern 360P may have a uniform thickness. The second sacrificial film pattern 360P may include, for example, silicon oxide. However, the present disclosure is not limited thereto.

Figure 18:
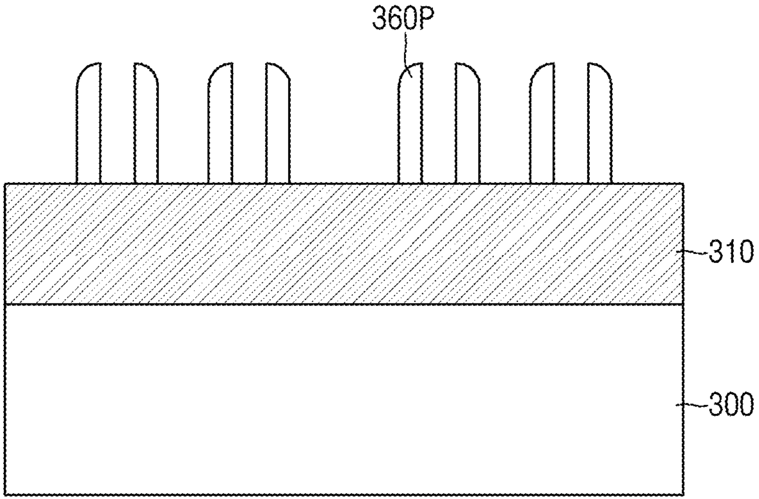

Referring to FIG. 18, the first mask pattern 320P may be removed. A portion of a top face of the pre-third pattern 310 may be exposed by removing the first mask pattern 320P.

Figure 19:
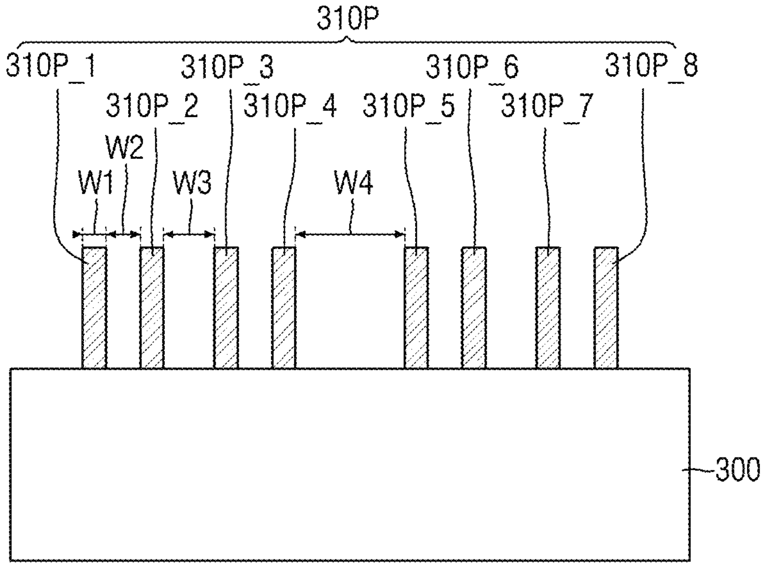

Referring to FIG. 19, an etching process may be performed using the second sacrificial film pattern 360P as an etching mask to form a plurality of third patterns 310P. The plurality of third patterns 310P may be formed by removing a portion of the pre-third pattern 310.

Widths W1 of the plurality of third patterns 310P may be equal to each other. The width W1 of each of the plurality of third patterns 310P may be substantially equal to a width of the second sacrificial film pattern 360P. The plurality of third patterns 310P may be spaced apart from each other. For example, the plurality of second patterns 310P may include a first sub-pattern 310P_1, a second sub-pattern 310P_2, a third sub-pattern 310P_3, a fourth sub-pattern 310P_4, a fifth sub-pattern 310P_5, a sixth sub-pattern 310P_6, a seventh sub-pattern 310P_7, and an eighth sub-pattern 310P_8. The first sub-pattern 310P_1 and the second sub-pattern 310P_2 may be spaced apart from each other by a first spacing W2. The first spacing W2 may depend on a width of the first sacrificial film pattern 350P in FIG. 15. The second sub-pattern 310P_2 and the third sub-pattern 310P_3 may be spaced apart from each other by a second spacing W3. The second spacing W3 may depend on a width of the second photoresist pattern 340P in FIG. 11. The fourth sub-pattern 310P_4 and the fifth sub-pattern 310P_5 may be spaced apart from each other by a third spacing W4. The third spacing W4 may depend on a spacing between the second photoresist patterns 340P in FIG. 11.

In some embodiments, the widths W1 of, the first spacing W2 between, the second spacing W3 between, and the third spacing W4 between the plurality of third patterns 210P may be different from each other. When the widths W1 of, the first spacings W2 between, the second spacing W3 between, and the third spacing W4 between the plurality of third patterns 310P are different from each other, it may be determined that there is a defect in the photo process or the etching process.

When the dose of light is variably irradiated, the second spacing W2 may vary depending on an amount of the irradiated dose of light when the etching process condition is not changed. When the etching process condition is not changed, the widths W1 of the plurality of third patterns 310P may be uniform regardless of the amount of the irradiated dose of light. Accordingly, the dose of light is variably irradiated and then the plurality of third patterns 310P are formed and then the widths W1 of the plurality of third patterns 310P and the spacings W2, W3, and W4 between the plurality of third patterns 310P are measured. Then, the cause of the defect in the photo process may be identified based on the measurement result.

The critical dimension defect between the third patterns 310P may be solved by changing the condition of the photo process based on the identified defect cause.

Referring to FIG. 1 to FIG. 9, forming the plurality of first patterns 110P may include performing a double patterning process. Further, referring to FIG. 11 to FIG. 19, forming the plurality of third patterns 310P may include performing a quadruple patterning process. However, the technical idea of the present disclosure is not limited thereto.

FIG. 20 to FIG. 27 are diagrams for illustrating a critical dimension inspection method according to still another embodiment. FIG. 20 to FIG. 27 may be, for example, diagrams for inspecting a critical dimension defect of a bit-line in a DRAM. However, the technical spirit of the present disclosure is not limited thereto. For reference, FIG. 21 may be a cross-sectional view taken along a line A-A of FIG. 20, and FIG. 22 to FIG. 27 may be cross-sectional views taken along a line B-B of FIG. 20.

Figure 20:
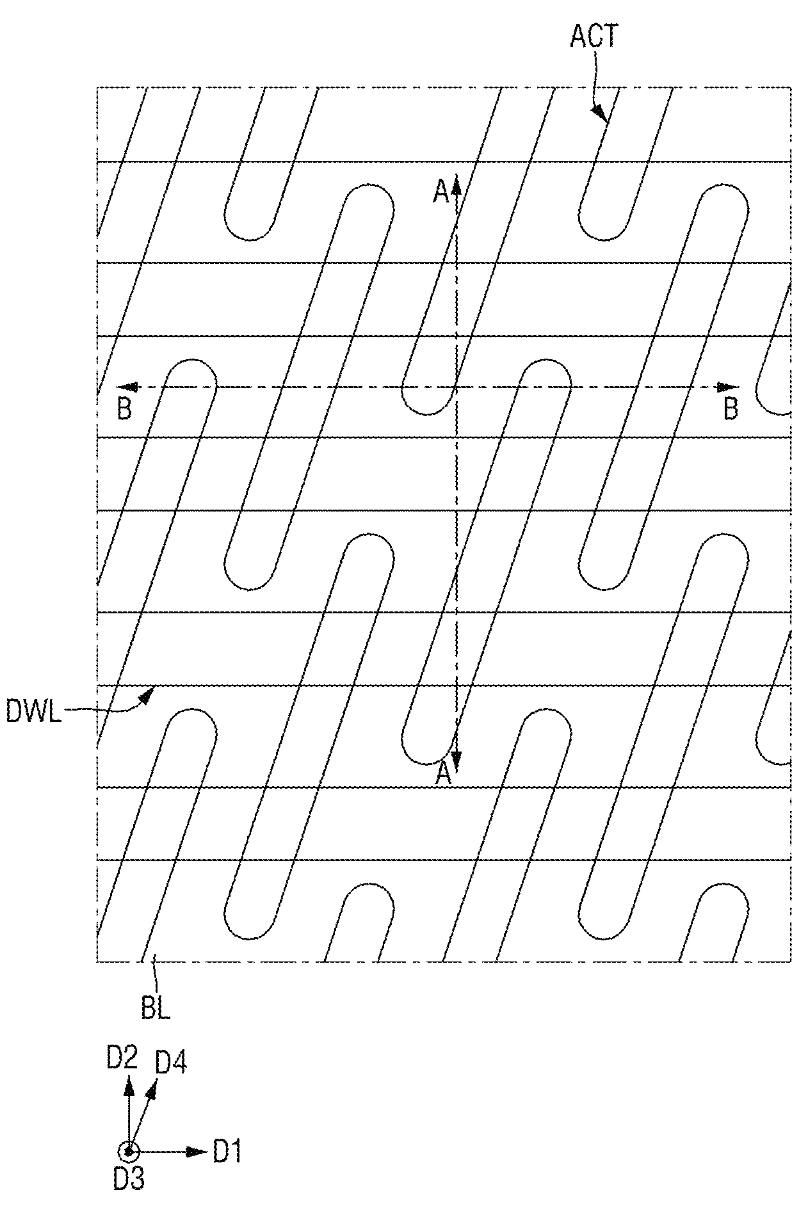
FIG. 20 to FIG. 27 are diagrams for illustrating a critical dimension inspection method according to still another embodiment.
Figure 21:
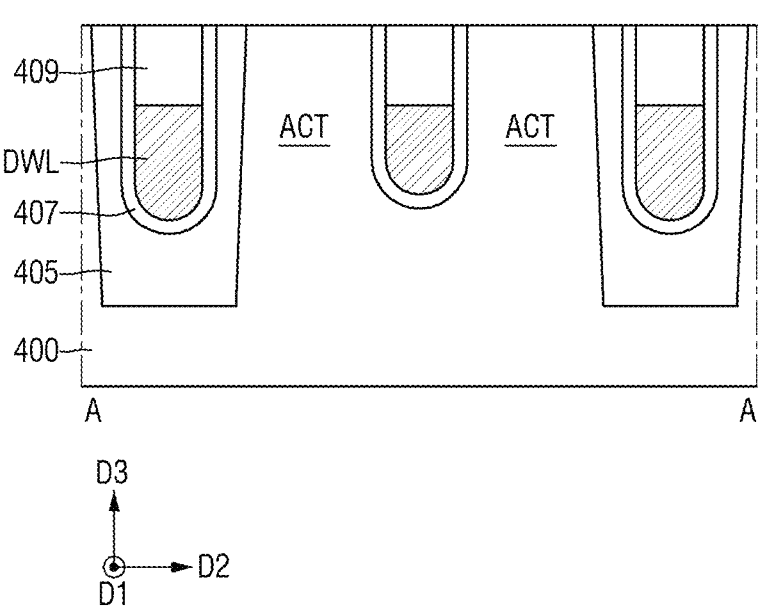
Figure 22:
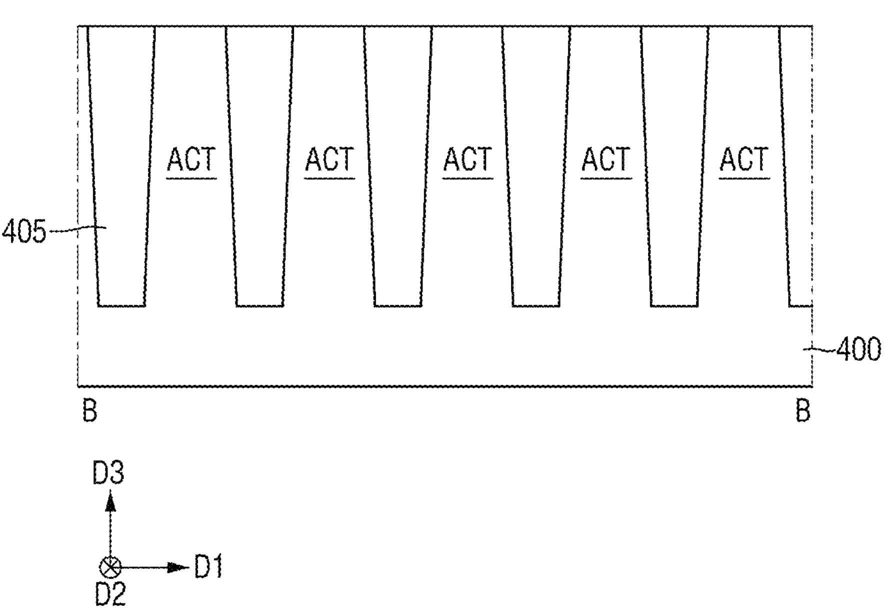

Referring to FIG. 20 to FIG. 22, a fourth substrate 400 is provided. The fourth substrate 400 may be embodied as, for example, a silicon single crystal substrate or an SDI (Silicon on Insulator) substrate. Alternatively, the fourth substrate 400 may include silicon germanium, SGOI (silicon germanium on insulator), indium antimonide, a lead telluride compound, indium arsenide, indium phosphide, gallium arsenide, or gallium antimonide. However, the present disclosure is not limited thereto.

An element isolation film 405 may be formed in the fourth substrate 400. The element isolation film 405 may define an active area ACT. The active area ACT may extend in a form of a bar of a diagonal line or an oblique line. For example, the active area ACT may extend in a fourth direction D4.

The active areas ACT may be arranged in a first direction D1. An end of one active area ACT may be adjacent to a center of another neighboring active area ACT. In this regard, the first direction D1, a second direction D2, and a third direction D3 may be perpendicular to each other. The fourth direction D4 may be any direction between the first direction D1 and the second direction D2.

A dummy word-line DWL may be formed in the fourth substrate 400. The dummy word-line DWL may extend in the first direction D1. The dummy word-lines DWL may be spaced apart from each other in the second direction D2. The dummy word-line DWL may include at least one of a metal, a metal alloy, a conductive metal nitride, a conductive metal carbonitride, a conductive metal carbide, a metal silicide, a doped semiconductor material, a conductive metal oxynitride, and a conductive metal oxide. The dummy word-line DWL may include, for example, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx or combinations thereof. However, the present disclosure is not limited thereto.

A gate insulating film 407 may be formed in the fourth substrate 400. The gate insulating film 407 may cover the dummy word-line DWL. The gate insulating film 407 may include, for example, at least one of silicon oxide, silicon nitride, silicon oxynitride, or a high dielectric constant material having a higher dielectric constant than that of silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. The present disclosure is not limited thereto.

A gate capping film 409 may be formed in the fourth substrate 400. The gate capping film 409 may cover a top face of the dummy word-line DWL. The gate capping film 409 may include, for example, polysilicon or polysilicon germanium. However, the present disclosure is not limited thereto.

Figure 23:
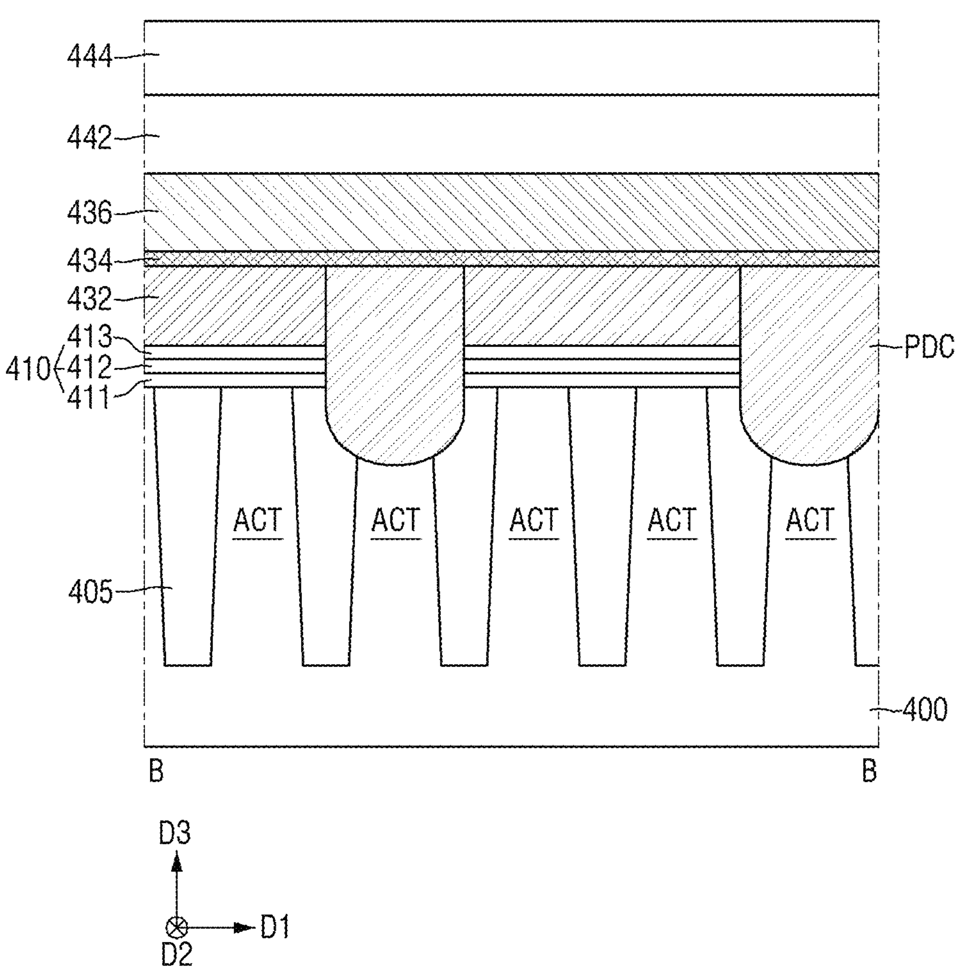

Referring to FIG. 23, a cell buffer film 410 may be formed on the fourth substrate 400. The cell buffer film 410 may include a first cell insulating film 411, a second cell insulating film 412, and a third cell insulating film 413. The second cell insulating film 412 may include a material having an etch selectivity to a material of each of the first cell insulating film 411 and the third cell insulating film 413. For example, the second cell insulating film 412 may include silicon nitride. Each of the first and third cell insulating films 411 and 413 may include silicon oxide.

A lower electrode film 432, a middle electrode film 434, an upper electrode film 436, a first capping film 442, and a second capping film 444 may be sequentially stacked on the cell buffer film 410. A pre-direct contact PDC that extends through the cell buffer film 410 and the lower electrode film 432 and is connected to the fourth substrate 400 may be formed.

The lower electrode film 432 may include, for example, an impurity-doped polysilicon film. The middle electrode film 434 may be made of, for example, TiSiN. The upper electrode film 436 may be made of, for example, tungsten (W). Each of the first capping film 442 and the second capping film 444 may be made of, for example, silicon nitride. The pre-direct contact PDC may include, for example, an impurity-doped polysilicon film.

Figure 24:
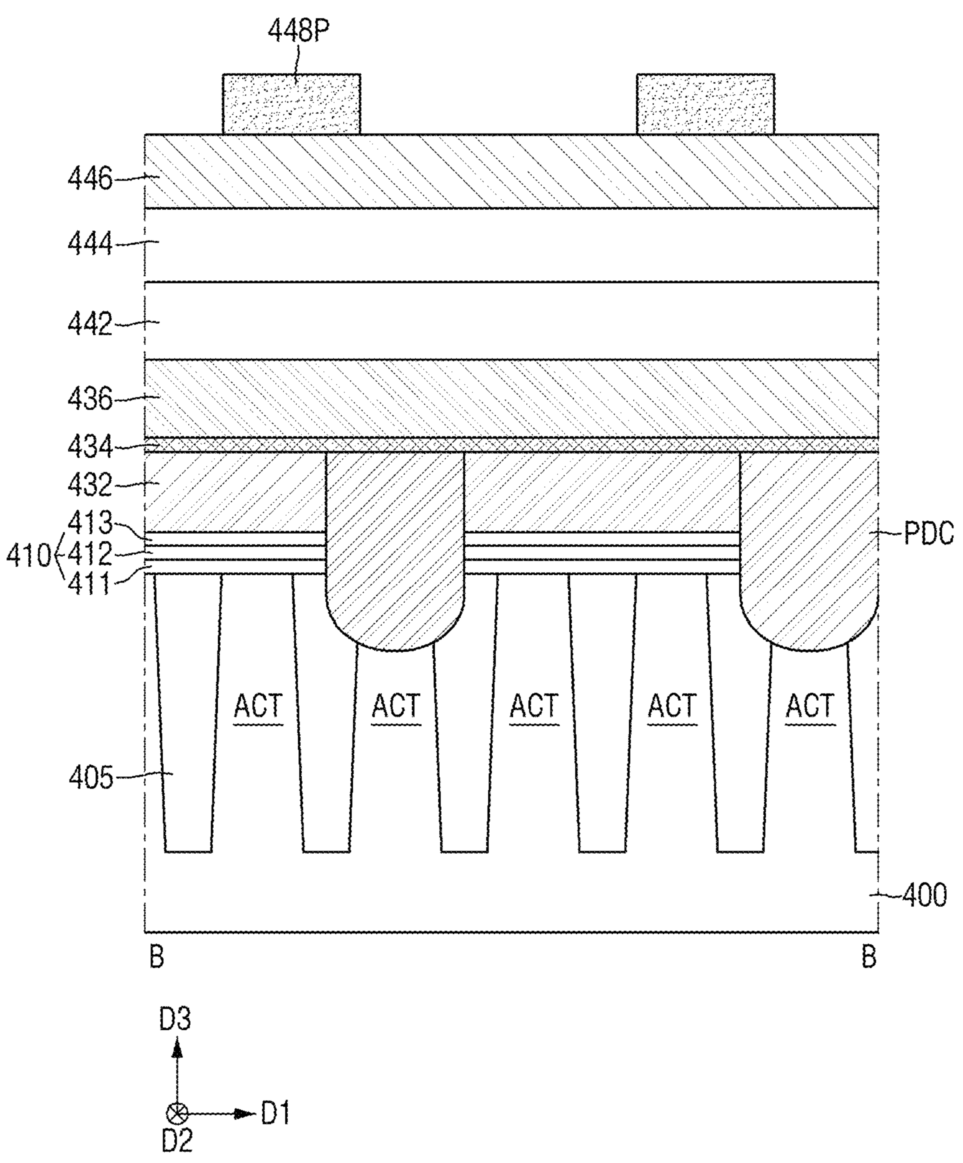

Referring to FIG. 24, a mask film 446 may be formed on the second capping film 444. The mask film 446 may include, for example, at least one of a SOH (spin on hardmask film) or a carbon polymer film. However, the present disclosure is not limited thereto.

Although not shown, a photoresist may be formed on the mask film 446. A dose of light may be irradiated onto the photoresist. The dose of light may be variably irradiated onto the photoresist. A photoresist pattern 448P may be formed in a photo process and a developing process. When the photoresist is a positive photoresist, the photoresist pattern 448P may be a portion not exposed to light. When the photoresist is a negative photoresist, the photoresist pattern 448P may be a portion exposed to light.

Figure 25:
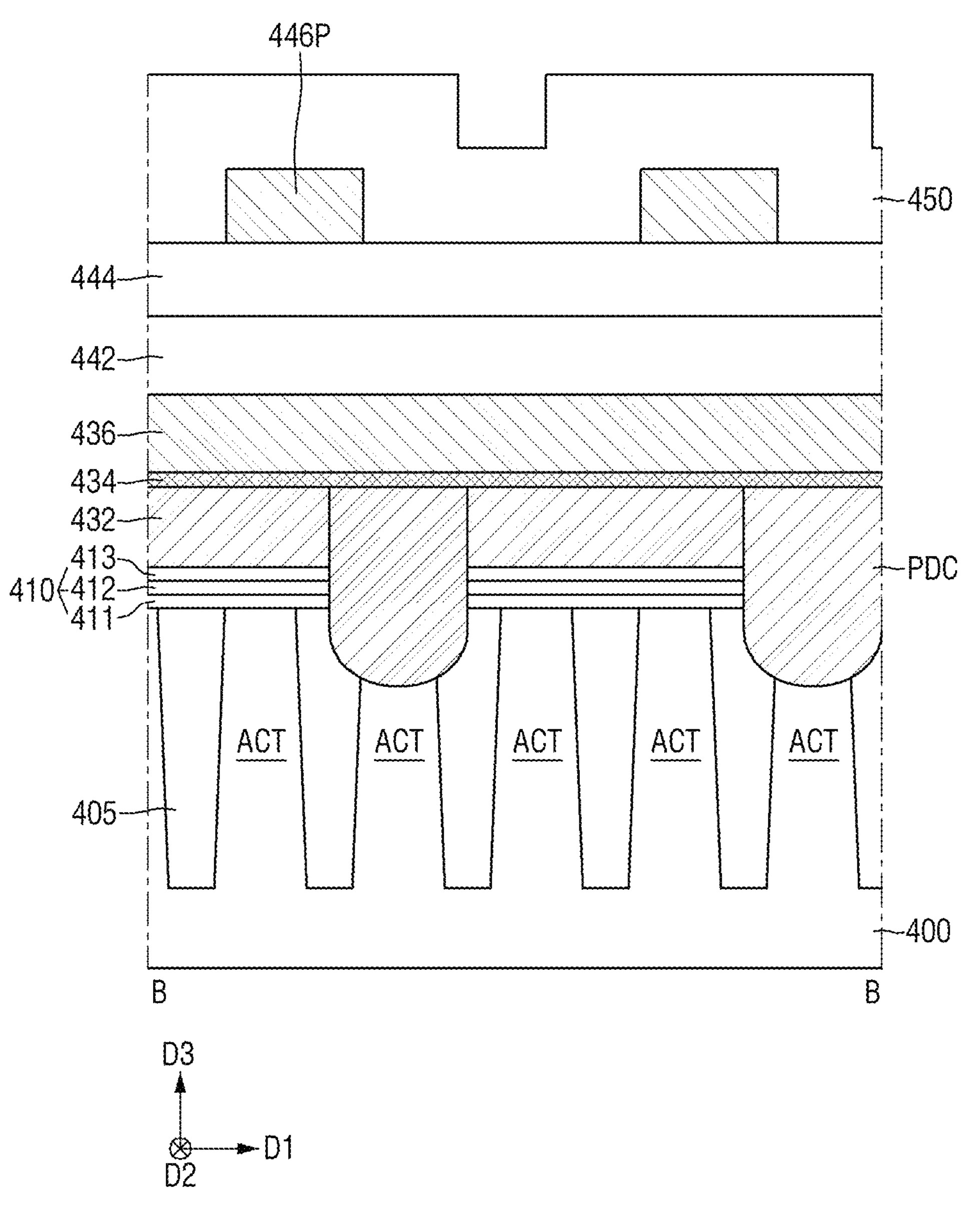

Referring to FIG. 25, the mask film 446 may be etched using the photoresist pattern 448P as an etching mask in an etching process. The mask film 446 may be etched to form a mask film pattern 446P.

Subsequently, a sacrificial film 450 may be formed along and on a top face of the mask film pattern 446P, a sidewall of the mask film pattern 446P, and a top face of the second capping film 444. The sacrificial film 450 may have a uniform thickness. The sacrificial film 450 may be formed using an ALD (atomic layer deposition) process. The sacrificial film 450 may include, for example, silicon oxide. However, the present disclosure is not limited thereto.

Figure 26:
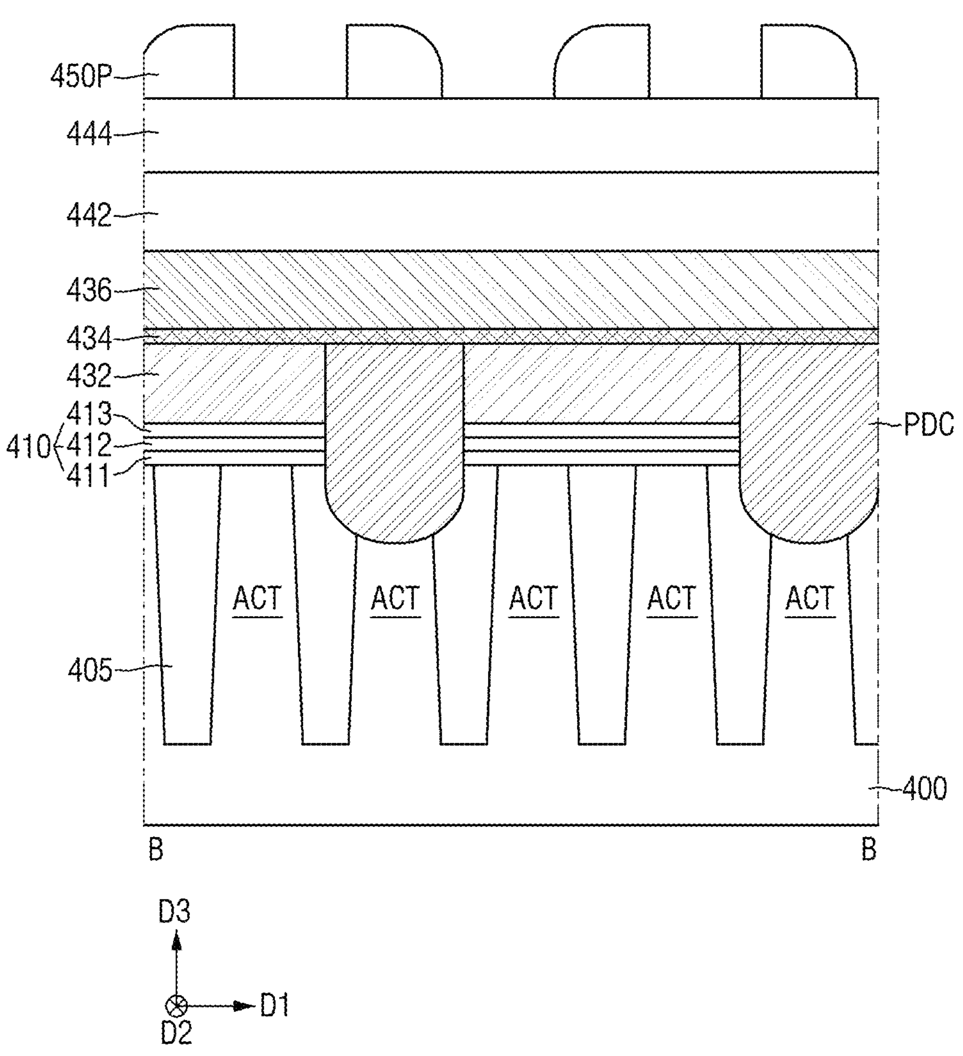

Referring to FIG. 26, a portion of the sacrificial film 450 may be removed to form a sacrificial film pattern 450P. After the sacrificial film pattern 450P has been formed, the mask film pattern 446P may be removed.

Figure 27:
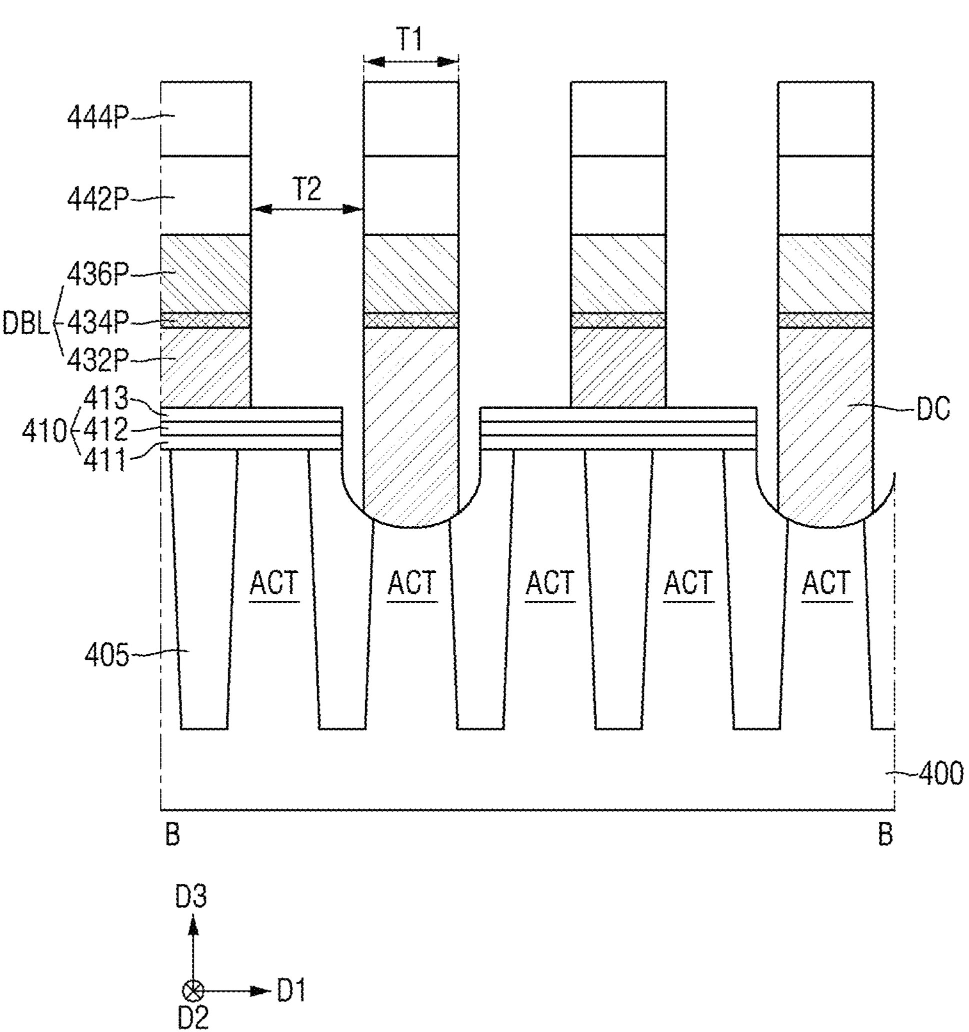

Referring to FIG. 27, an etching process may be performed using the sacrificial film pattern 450P as an etching mask such that a plurality of dummy bit-lines DBL, a plurality of first capping patterns 442P, and a plurality of second capping patterns 444P may be formed. Each of the plurality of dummy bit-lines DBL may extend in the second direction D2. The plurality of dummy bit-lines DBL may be spaced apart from each other in the first direction DE The dummy bit-line DBL may include a dummy lower electrode pattern 432P, a dummy middle electrode pattern 434P, and a dummy upper electrode pattern 436P.

Dimensions T1 in the first direction D1 of the dummy bit-lines DBL may be equal to each other. The dimension T1 in the first direction D1 of the dummy bit-line DBL may be substantially equal to a width of the sacrificial film pattern 450P. The plurality of dummy bit-lines DBL may be spaced apart from each other in the first direction D1.

A spacing T2 between two adjacent to each other in the first direction D1 of the plurality of dummy bit-lines DBL may depend on a width of the photoresist pattern 448P in FIG. 24 or a spacing between adjacent ones of the photoresist patterns 448P.

In some embodiments, the dimension T1 in the first direction D1 of the dummy bit-line DBL, and the spacing T2 between two adjacent to each other in the first direction D1 of the plurality of dummy bit-lines DBL may be different from each other. When the dimension T1 in the first direction D1 of the dummy bit-line DBL, and the spacing T2 between two adjacent to each other in the first direction D1 of the plurality of dummy bit-lines DBL are different from each other, it may be determined that there is a defect in the photo process or the etching process.

When the dose of light is variably irradiated, the spacing T2 between two adjacent to each other in the first direction D1 of the plurality of dummy bit-lines DBL may vary depending on an amount of the irradiated dose of light when the etching process condition is not changed. When the etching process condition is not changed, the dimension T1 in the first direction D1 of the dummy bit-line DBL may be constant regardless of the amount of the irradiated dose of light. Thus, the dose of light may be variably irradiated, and then the plurality of dummy bit-lines DBL may be formed, and then the dimension T1 in the first direction D1 of the dummy bit-line DBL, and the spacing T2 between two adjacent to each other in the first direction D1 of the plurality of dummy bit-lines DBL may be measured. Then, the cause of the defect in the photo process may be identified based on the measured dimension T1 and the measured spacing T2.

Thus, an optimal condition of the photo process may be inferred (or selected) based on the identified cause of the defect in the photo process. Then, the semiconductor device may be manufactured using the optimal condition.

Figure 28:
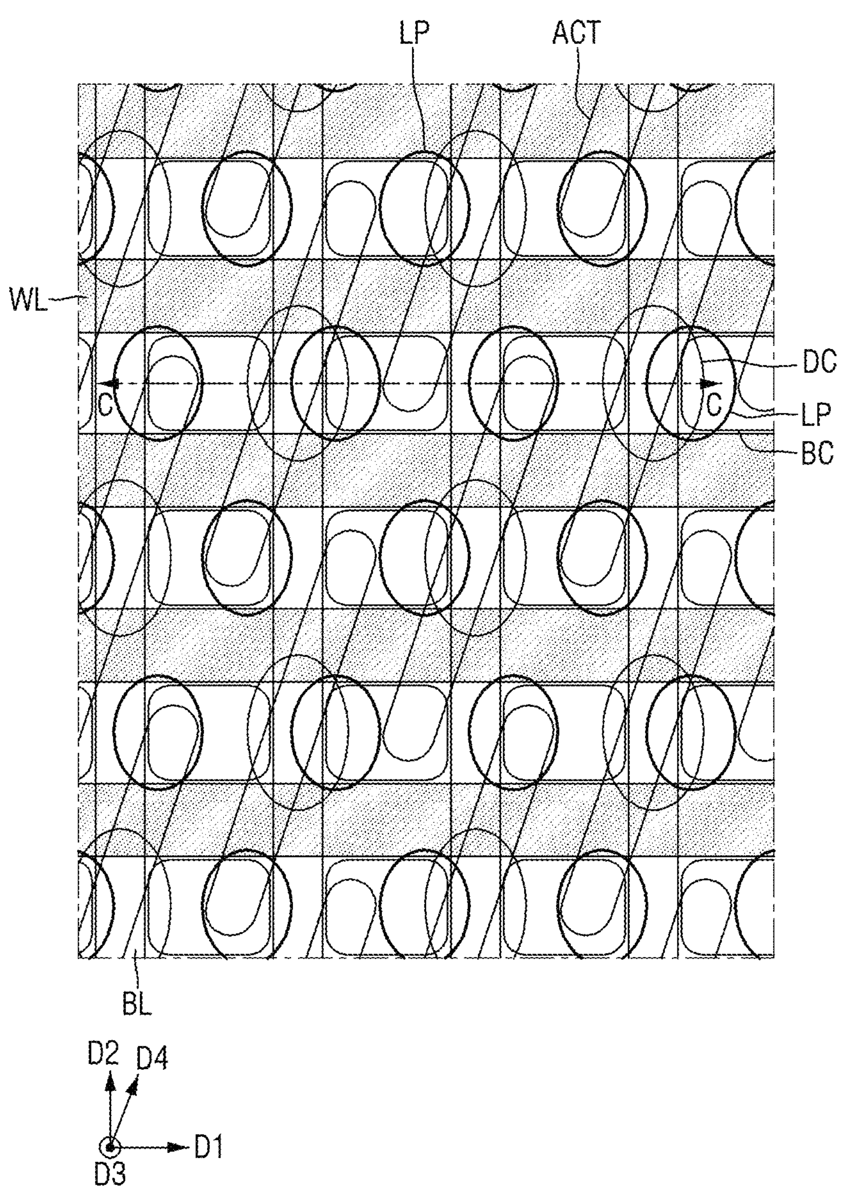
FIG. 28 is a layout diagram of a semiconductor device manufactured using a critical dimension inspection method according to some embodiments.
Figure 29:
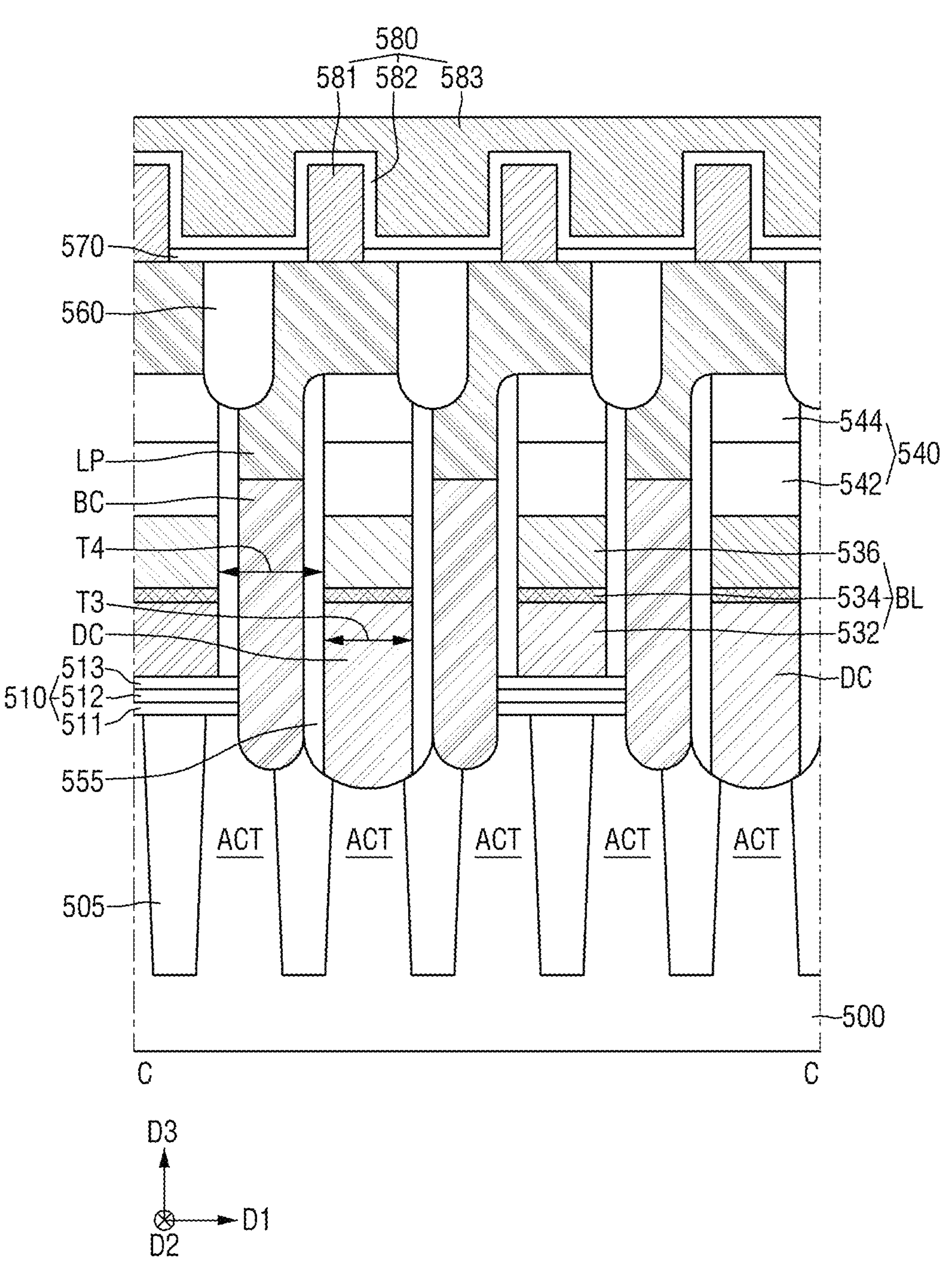
FIG. 29 is a cross-sectional view taken along a line C-C of FIG. 28.

FIG. 28 is a layout diagram of a semiconductor device manufactured using a critical dimension inspection method according to some embodiments. FIG. 29 is a cross-sectional view taken along a line C-C of FIG. 28. For reference, FIG. 28 and FIG. 29 may be diagrams of a semiconductor device manufactured using the optimal condition of the photo process inferred (or selected) with reference to FIGS. 20 to 27.

Referring to FIG. 28 and FIG. 29, a fifth substrate 500 is provided. The fifth substrate 500 may be different from the fourth substrate 400. The fifth substrate 500 may be embodied as, for example, a silicon single crystal substrate or an SDI (Silicon on Insulator) substrate. Alternatively, the fifth substrate 500 may include silicon germanium, SGOI (silicon germanium on insulator), indium antimonide, a lead telluride compound, indium arsenide, indium phosphide, gallium arsenide, or gallium antimonide. However, the present disclosure is not limited thereto.

An element isolation film 505 may be disposed in the fifth substrate 500. As a semiconductor device design rule is reduced, the active area ACT may extend in a form of a bar of a diagonal line or an oblique line as shown in FIG. 28. For example, the active area ACT may extend in the fourth direction D4.

The active area ACT may be arranged in the first direction D1 and extend in a parallel manner to each other. An end of one active area ACT may be adjacent to a center of another neighboring active area ACT.

The semiconductor device according to some embodiments may include various contact arrangements formed on the active area ACT. The various contact arrangements may include, for example, a direct contact (DC), a buried contact (BC), and a landing pad (LP).

In this regard, the direct contact DC may mean a contact that electrically connects the active area ACT to the bit-line BL. The buried contact BC may mean a contact connecting the active area ACT to a capacitor lower electrode 581. Due to an arrangement structure, a contact area between the buried contact BC and the active area ACT may be small. Thus, a conductive landing pad LP may be introduced to increase the contact area between the buried contact BC and the capacitor lower electrode 581 and increase the contact area between the buried contact BC and the active area ACT.

The landing pad LP may be disposed between the active area ACT and the buried contact BC, or between the buried contact BC and the capacitor lower electrode 581. In the semiconductor device according to some embodiments, the landing pad LP may be disposed between the buried contact BC and the capacitor lower electrode 581. The increase in the contact area via the introduction of the landing pad LP may allow a contact resistance between the active area ACT and the capacitor lower electrode 581 to be reduced.

Word-lines WL may be buried in the fifth substrate 500. The word-lines WL may extend across the active area ACT. The word-lines WL may extend in the first direction D1. The word-lines WL may be spaced apart from each other in the second direction D2. The word-lines WL are buried in the fifth substrate 500 and may extend in the first direction D1. Although not shown, a doped area may be formed in the active area ACT and between the word-lines WL. The doped area may be doped with N-type impurities.

A cell buffer film 510 may be disposed on the fifth substrate 500. The cell buffer film 510 may include a first cell insulating film 511, a second cell insulating film 512, and a third cell insulating film 513 that are sequentially stacked.

Bit-lines BL may be disposed on the cell buffer film 510. The bit-lines BL may extend across the fifth substrate 500 and the word-lines WL. As shown in FIG. 29, the bit-lines BL may extend in the second direction D2. The bit-lines BL may be spaced apart from each other in the first direction D1.

In some embodiments, a dimension T3 in the first direction D1 of the bit-line BL may be substantially equal to a spacing T4 between two adjacent to each other in the first direction D1 of the bit-lines BL. Although not shown, the bit-line BL may be formed in a photo process of a first condition and an etching process of a second condition. The first condition may be inferred (or selected) using the critical dimension inspection method as described above using FIG. 20 to FIG. 27. The second condition may be the same as the condition of the etching process performed in the critical dimension inspection method as described above using FIG. to FIG. 27.

The bit-line BL may include a bit-line lower electrode 532, a bit-line middle electrode 534, and a bit-line upper electrode 536 that are sequentially stacked. The bit-line lower electrode 532 may include, for example, an impurity-doped polysilicon film. The bit-line middle electrode 534 may be made of, for example, TiSiN. The bit-line upper electrode 536 may be made of, for example, tungsten (W).

A bit-line capping pattern 540 may be disposed on the bit-line BL. The bit-line capping pattern 540 may include a first bit-line capping pattern 542 and a second bit-line capping pattern 544 that are sequentially stacked.

A bit-line spacer 555 may be formed on a sidewall of the bit-line BL and a sidewall of the bit-line capping pattern 540. The bit-line spacer 555 may be disposed on the fifth substrate 500 and the element isolation film 505 and in an area of the bit-line BL in which the direct contact DC is formed. However, in an area in which the direct contact DC is not formed, the bit-line spacer 555 may be disposed on the cell buffer film 510.

The bit-line spacer 555 may be embodied as a single layer as shown. In another example, the bit-line spacer 555 may be embodied as a multi-layer. For example, the bit-line spacer 555 may include one of a silicon oxide film, a silicon nitride film, a silicon oxynitride film (SiON), a silicon oxycarbonitride film (SiOCN), an air, and combinations thereof. However, the present disclosure is not limited thereto.

The cell buffer film 510 may be interposed between the bit-line BL and the element isolation film 505 and between the bit-line spacer 555 and the fifth substrate 500.

The bit-line BL may be electrically connected to the doped area of the active area ACT via the direct contact DC. The direct contact DC may made of, for example, polysilicon doped with impurity.

The buried contact BC may be formed between a pair of adjacent bit-lines BL. The buried contacts BC may be spaced apart from each other. The buried contact BC may include at least one of polysilicon doped with impurity, a conductive silicide compound, a conductive metal nitride, and a metal. The buried contacts BC may individually have island shapes that are spaced apart from each other in a plan view. The buried contact BC may extend through the cell buffer film 510 and come into contact with the doped areas of the active area ACT.

The landing pad LP may be formed on the buried contact BC. The landing pad LP may be electrically connected to the buried contact BC. The landing pad LP may overlap a portion of a top face of the bit-line BL. The landing pad LP may include, for example, at least one of a semiconductor material doped with impurity, a conductive silicide compound, a conductive metal nitride, a conductive metal carbide, a metal, and a metal alloy.

A pad isolation insulating film 560 may be formed on the landing pad LP and the bit-line BL. For example, the pad isolation insulating film 560 may be disposed on the bit-line capping pattern 540. The pad isolation insulating film 560 may define an area of the landing pad LP as each of a plurality of island areas. Further, the pad isolation insulating film 560 may not cover a top face of the landing pad LP.

The pad isolation insulating film 560 may include an insulating material to electrically insulate the plurality of landing pads LP from each other. For example, the pad isolation insulating film 560 may include, for example, at least one of a silicon oxide film, a silicon nitride film, a silicon oxynitride film, a silicon oxycarbonitride film, and a silicon carbonitride film.

An etch stop film 570 may be formed on the pad isolation insulating film 560 and the landing pad LP. The etch stop film 570 may include at least one of a silicon nitride film, a silicon carbonitride film, a silicon boron nitride film (SiBN), a silicon oxynitride film, and a silicon oxycarbide film.

A capacitor 580 may be formed on the landing pad LP. The capacitor 580 may be electrically connected to the landing pad LP. A portion of the capacitor 580 may be disposed in the etch stop film 570. The capacitor 580 includes a capacitor lower electrode 581, a capacitor dielectric film 582, and a capacitor upper electrode 583.

The capacitor lower electrode 581 may be disposed on the landing pad LP. It is illustrated that the capacitor lower electrode 581 has a pillar shape. However, the present disclosure is not limited thereto. In another example, the capacitor lower electrode 581 may have a cylindrical shape. The capacitor dielectric film 582 is formed on the capacitor lower electrode 581. The capacitor dielectric film 582 may be formed along a profile of the capacitor lower electrode 581. The capacitor upper electrode 583 is formed on the capacitor dielectric film 582. The capacitor upper electrode 583 may surround an outer sidewall of the capacitor lower electrode 581.

Each of the capacitor lower electrode 581 and the capacitor upper electrode 583 may include, for example, a doped semiconductor material, a conductive metal nitride such as titanium nitride, tantalum nitride, niobium nitride or tungsten nitride, a metal such as ruthenium, iridium, titanium or tantalum, or a conductive metal oxide, for example, iridium oxide or niobium oxide, etc. However, the present disclosure is not limited thereto.

The capacitor dielectric film 582 may include one of, for example, silicon oxide, silicon nitride, silicon oxynitride, a high dielectric constant material, or combinations thereof. However, the present disclosure is not limited thereto. In the semiconductor device according to some embodiments, the capacitor dielectric film 582 may include a stacked film structure in which a zirconium oxide film, an aluminum oxide film, and a zirconium oxide film are sequentially stacked on top of each other. In the semiconductor memory device according to some embodiments, the capacitor dielectric film 582 may include a dielectric film including hafnium (HD. In the semiconductor device according to some embodiments, the capacitor dielectric film 582 may have a stacked film structure of a ferroelectric material film and a paraelectric material film.

While some example embodiments of the present disclosure have been described above with reference to the accompanying drawings, inventive concepts may be implemented in various different forms. Those skilled in the art to which the present disclosure pertains may understand that embodiments of inventive concepts may be implemented in other specific forms without departing from the spirit and scope of inventive concepts. Therefore, it should be understood that the example embodiments described above are illustrative in all aspects and not restrictive.

What is claimed is:

1. A method for inspecting a critical dimension, the method comprising:

applying a photoresist on a substrate;

variably irradiating a dose of light onto the photoresist;

performing a photo process on the photoresist, the photo process including developing the photoresist to form a photoresist pattern;

forming a plurality of patterns on the substrate, the forming the plurality of patterns including performing an etching process using the photoresist pattern as an etching mask;

measuring a width of each of the plurality of patterns and a spacing between adjacent ones of the plurality of patterns to obtain a measured width and a measured spacing; and identifying a cause of a defect in the photo process based on the measured width and the measured spacing.

2. The method of claim 1, wherein the substrate includes a plurality of shot areas, each of the plurality of shot areas is a minimum area by which the photoresist is developed, and the variably irradiating the dose of light includes irradiating the dose of light variably onto an entirety of a face of the substrate such that the dose of light is uniformly irradiated onto each of the plurality of shot areas.

3. The method of claim 1, wherein the variably irradiating the dose of light onto the photoresist includes irradiating the dose of light variably onto the photoresist on the substrate such that the dose of light is uniformly irradiated onto each of a plurality of shot areas, uniformly irradiated onto and along a first position spaced apart by a first distance from a center of the substrate, and uniformly irradiated onto and along a second position spaced apart by a second distance from the center of the substrate, the first distance and the second distance are different from each other, and an amount of the dose of light irradiated from the center of the substrate to and along the first position is different from an amount of the dose of light irradiated to and along the second position.

4. The method of claim 1, wherein the variably irradiating the dose of light includes irradiating the dose of light variably onto an entirety of a face of the substrate such that the dose of light is uniformly irradiated onto and along a position spaced apart by a first distance from a center of the substrate, and the variably irradiating of the dose of light includes irradiating the dose of light variably onto the entirety of the face of the substrate such that the dose of light is uniformly irradiated onto and along a position spaced apart by a second distance from the center of the substrate, and the first distance and the second distance are different from each other.

5. The method of claim 1, wherein the forming of the plurality of patterns includes performing a double patterning process or performing a quadruple patterning process, the plurality of patterns include a first group of patterns and a second group of patterns that are spaced apart from each other by a distance greater than the spacing between the adjacent ones of the plurality of patterns, and the width of each of the plurality of patterns in the first group of patterns is substantially equal to the width of each of the plurality of patterns in the second group of patterns.

6. The method of claim 1, wherein a cause of a defect in the etching process is not identified based on the measured width and the measured spacing.

7. A method for manufacturing a semiconductor device, the method comprising:

forming a plurality of second patterns on a first substrate by performing a first photo process under a first condition and an etching process under a second condition, wherein the first condition is obtained using a critical dimension inspection method, wherein the critical dimension inspection method includes applying a photoresist on a second substrate different from the first substrate, variably irradiating a dose of light onto the photoresist, performing a second photo process on the photoresist, the second photo process including developing the photoresist to form a photoresist pattern, forming a plurality of first patterns on the second substrate by performing an etching process under the second condition using the photoresist pattern as an etching mask, measuring a width of each of the plurality of first patterns and a spacing between adjacent ones of the plurality of first patterns to obtain a measured width and a measured spacing, identifying an identified cause of a defect in the second photo process based on the measured width and the measured spacing, and selecting the first condition based on the identified cause of the defect.

8. The method of claim 7, wherein the second substrate includes a plurality of shot areas, each of the plurality of shot areas is a minimum area by which the photoresist is developed, the variably irradiating of the dose of light includes irradiating the dose of light variably onto an entirety of a face of the second substrate such that the dose of light is uniformly irradiated onto each of the plurality of shot areas.

9. The method of claim 7, wherein the second substrate includes a plurality of shot areas, the variably irradiating the dose of light onto the photoresist includes irradiating the dose of light variably onto the photoresist on the second substrate such that the dose of light is uniformly irradiated onto each of the plurality of shot areas, uniformly irradiated onto and along a first position on the second substrate that is spaced apart by a first distance from a center of the second substrate, and uniformly irradiated onto and along a second position of the second substrate that is spaced apart by a second distance from the center of the second substrate, the first distance and the second distance are different from each other, and an amount of the dose of light irradiated from the center of the second substrate to and along the first position of the second substrate is different from an amount of the dose of light irradiated to and along the second position of the second substrate.

10. The method of claim 7, wherein the variably irradiating of the dose of light includes irradiating the dose of light variably onto an entirety of a face of the second substrate such that the dose of light is uniformly irradiated onto and along a position spaced apart by a first distance from a center of the second substrate, and the variably irradiating of the dose of light includes irradiating the dose of light variably onto the entirety of the face of the second substrate such that the dose of light is uniformly irradiated onto and along a position spaced apart by a second distance from the center of the second substrate, and the first distance and the second distance are different from each other.

11. The method of claim 7, wherein the forming the plurality of first patterns and the forming the plurality of second patterns each include performing a double patterning process or a quadruple patterning process, the plurality of first patterns include a first group of first patterns and a second group of first patterns that are spaced apart from each other by a distance greater than the spacing between the adjacent ones of the plurality of first patterns, and the width of each of the plurality of first patterns in the first group of first patterns is substantially equal to the width of each of the plurality of first patterns in the second group of first patterns.

12. The method of claim 7, wherein the obtaining the first condition includes performing the critical dimension inspection method at least once.

13. The method of claim 7, wherein the first substrate includes a center area and an edge area surrounding the center area, and a difference between an average value of spacings between adjacent ones of the plurality of second patterns in the center area and an average value of spacings between adjacent ones of the plurality of second patterns in the edge area is equal to or smaller than 0.3 nm.

14. A method for manufacturing a semiconductor device, the method comprising:

forming a plurality of word-lines in a first substrate and extending in a first direction;

forming a plurality of bit-lines on the first substrate and extending in a second direction, the second direction intersecting the first direction, the forming the plurality of bit-lines including a first photo process under a first condition and an etching process under a second condition;

forming a plurality of contacts connected to the first substrate, each of the plurality of contacts being disposed between adjacent ones of the plurality of bit-lines; and forming a plurality of capacitors respectively connected to the plurality of contacts, wherein the first condition is obtained through a critical dimension inspection method, wherein the critical dimension inspection method includes forming a dummy word-line in a second substrate and extending in the first direction, the second substrate being different from the first substrate, applying a photoresist on the second substrate, variably irradiating a dose of light onto the photoresist, performing a second photo process on the photoresist, the second photo process including developing the photoresist to form a photoresist pattern, performing an etching process under the second condition using the photoresist pattern as an etching mask to form a plurality of dummy bit-lines extending in the second direction, measuring a width in the first direction of each of the plurality of dummy bit-lines and measuring a spacing between two dummy bit-lines adjacent to each other in the first direction of the plurality of dummy bit-lines to obtain a measured width and a measured spacing, identifying an identified cause of a defect in the second photo process based on the measured width and the measured spacing, and selecting the first condition based on the identified cause of the defect.

15. The method of claim 14, wherein the second substrate includes a plurality of shot areas, each of the plurality of shot areas is a minimum area by which the photoresist is developed, and the variably irradiating of the dose of light includes irradiating the dose of light variably onto an entirety of a face of the second substrate such that the dose of light is uniformly irradiated onto each of the plurality of shot areas.

16. The method of claim 14, wherein the second substrate includes a plurality of shot areas, the variably irradiating the dose of light onto the photoresist includes irradiating the dose of light variably onto the photoresist on the second substrate such that the dose of light is uniformly irradiated onto each of the plurality of shot areas, uniformly irradiated onto and along a first position on the second substrate that is spaced apart by a first distance from a center of the second substrate, and uniformly irradiated onto and along a second position of the second substrate that is spaced apart by a second distance from the center of the second substrate the first distance and the second distance are different from each other, and an amount of the dose of light irradiated from the center of the second substrate to and along the first position of the second substrate is different from an amount of the dose of light irradiated to and along the second position of the second substrate.

17. The method of claim 14, wherein the variably irradiating of the dose of light includes irradiating the dose of light variably onto an entirety of a face of the second substrate such that the dose of light is uniformly irradiated onto and along a position spaced apart by a first distance from a center of the second substrate, the variably irradiating of the dose of light includes irradiating the dose of light variably onto the entirety of the face of the second substrate such that the dose of light is uniformly irradiated onto and along a position spaced apart by a second distance from the center of the second substrate, and the first distance and the second distance are different from each other.

18. The method of claim 14, wherein the forming the plurality of bit-lines and the forming the plurality of dummy bit-lines each include performing a double patterning process or a quadruple patterning process, the plurality of dummy bit-lines include a first group of dummy bit-lines and a second group of dummy bit-lines that are spaced apart from each other by a distance greater than the spacing, and the width of each of the plurality of dummy bit-lines in the first group of dummy bit-lines is substantially equal to the width of each of the plurality of dummy bit-lines in the second group of dummy bit-lines.

19. The method of claim 14, wherein the obtaining the first condition includes performing the critical dimension inspection method at least once.

20. The method of claim 14, wherein the first substrate includes a center area and an edge area surrounding the center area, a difference between an average value of spacings between adjacent ones of the plurality of bit-lines in the center area and an average value of spacings between adjacent ones of the plurality of bit-lines in the edge area is equal to or smaller than 0.3 nm.

* * * * *